(12) United States Patent
Sakata et al.

(10) Patent No.: US 10,067,529 B2
(45) Date of Patent: Sep. 4, 2018

(54) DISPLAY DEVICE

(71) Applicant: SONY CORPORATION, Tokyo (JP)

(72) Inventors: Tatsuya Sakata, Tokyo (JP); Makoto Miyashita, Tokyo (JP); Toyoki Takahashi, Tokyo (JP); Daiki Adachi, Tokyo (JP); Sachiko Koyama, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/423,310

(22) Filed: Feb. 2, 2017

(65) Prior Publication Data

US 2017/0147031 A1 May 25, 2017

Related U.S. Application Data

(63) Continuation of application No. 13/923,825, filed on Jun. 21, 2013, now Pat. No. 9,609,699, which is a
(Continued)

(30) Foreign Application Priority Data

May 23, 2007 (JP) .................... 2007-137109

(51) Int. Cl.
*G06F 1/16* (2006.01)
*H05K 5/00* (2006.01)
(Continued)

(52) U.S. Cl.
CPC ........... *G06F 1/1601* (2013.01); *F16M 11/10* (2013.01); *H01L 51/0097* (2013.01);
(Continued)

(58) Field of Classification Search
CPC ......... G06F 1/16; G06F 1/1601; F16M 11/10; H01L 51/0097; H01L 51/5237; H01L 51/529
(Continued)

(56) References Cited

U.S. PATENT DOCUMENTS

| 349,489 A | 9/1886 | Fisher |
| 383,739 A | 5/1888 | Lillie |

(Continued)

FOREIGN PATENT DOCUMENTS

| JP | 60-165687 A | 8/1985 |
| JP | 61-139785 A | 6/1986 |

(Continued)

OTHER PUBLICATIONS

Determination of the rejection of the amendment dated Nov. 24, 2009 with English language translation from the Japanese Patent Office in corresponding Japanese Patent application No. 2007-137109.
(Continued)

*Primary Examiner* — Anthony Haughton
(74) *Attorney, Agent, or Firm* — Chip Law Group

(57) ABSTRACT

A display device of the present invention includes a body stand unit; a display displaying unit; and an arm unit, arranged upright from the body stand unit, for supporting the display displaying unit; where the arm unit is arranged on either left or right end side from a center in a horizontal direction of the display displaying unit, and supports the display displaying unit in a cantilever state.

20 Claims, 27 Drawing Sheets

Related U.S. Application Data continuation of application No. 12/125,257, filed on May 22, 2008, now Pat. No. 8,493,723.

(51) Int. Cl.
| | | |
|---|---|---|
| *H05K 7/00* | (2006.01) | |
| *H01L 51/00* | (2006.01) | |
| *H01L 51/52* | (2006.01) | |
| *F16M 11/10* | (2006.01) | |

(52) U.S. Cl.
CPC ........ *H01L 51/529* (2013.01); *H01L 51/5237* (2013.01); *F16M 2200/08* (2013.01); *H01L 2251/5338* (2013.01)

(58) Field of Classification Search
USPC .......................... 361/679.21–679.29, 679.55, 361/679.01–679.04
See application file for complete search history.

(56) References Cited

U.S. PATENT DOCUMENTS

| | | | |
|---|---|---|---|
| 5,179,447 A | 1/1993 | Lain | |
| 5,494,447 A | 2/1996 | Zaidan | |
| 6,189,602 B1 | 2/2001 | Tanahashi et al. | |
| 6,229,693 B1 | 5/2001 | Karidis et al. | |
| 6,307,530 B1* | 10/2001 | Cho .................... G02F 1/13452 | |
| | | | 345/87 |
| 7,068,497 B2 | 6/2006 | Chu | |
| 7,120,011 B2 | 10/2006 | Takahashi et al. | |
| 7,251,128 B2 | 7/2007 | Williams et al. | |
| 7,273,089 B2 | 9/2007 | Hata et al. | |
| D554,639 S | 11/2007 | Kim et al. | |
| 7,299,526 B2 | 11/2007 | Kim | |
| 7,567,436 B2 | 7/2009 | Jeong | |
| 7,570,389 B2 | 8/2009 | Silverbrook | |
| 7,612,991 B2 | 11/2009 | Sakata et al. | |
| 7,646,593 B2 | 1/2010 | Smejkalova | |
| 7,983,029 B2* | 7/2011 | Park ...................... F16M 11/16 | |
| | | | 174/88 R |
| 2004/0052044 A1 | 3/2004 | Mochizuki et al. | |
| 2004/0057197 A1* | 3/2004 | Hill ....................... G06F 1/1601 | |
| | | | 361/679.06 |
| 2005/0052834 A1 | 3/2005 | Tanaka et al. | |
| 2006/0197718 A1* | 9/2006 | Yamate .................. H05K 1/148 | |
| | | | 345/37 |
| 2006/0274225 A1 | 12/2006 | Cai et al. | |
| 2007/0050946 A1 | 3/2007 | Shih et al. | |
| 2007/0108909 A1* | 5/2007 | Jeong ....................... H05K 5/02 | |
| | | | 313/613 |
| 2008/0019088 A1 | 1/2008 | Williams et al. | |
| 2008/0094792 A1 | 4/2008 | Chen et al. | |
| 2008/0239640 A1 | 10/2008 | Park | |
| 2008/0315048 A1 | 12/2008 | Sakata et al. | |

FOREIGN PATENT DOCUMENTS

| | | |
|---|---|---|
| JP | 06-000979 A | 1/1994 |
| JP | 06-230852 A | 8/1994 |
| JP | 06-316240 A | 11/1994 |
| JP | 10-222091 A | 8/1998 |
| JP | 11-102235 A | 4/1999 |
| JP | 11-215448 A | 8/1999 |
| JP | 2000-244146 A | 9/2000 |
| JP | 3113423 B2 | 11/2000 |
| JP | 2000-357027 A | 12/2000 |
| JP | 3208088 B2 | 9/2001 |
| JP | 2002-023651 A | 1/2002 |
| JP | 2004-169901 A | 6/2004 |
| JP | 2004-219645 A | 8/2004 |
| JP | 2005-523042 A | 8/2005 |
| JP | 2006-030913 A | 2/2006 |
| JP | 2006-526515 A | 11/2006 |

OTHER PUBLICATIONS

Office Action for JP Patent Application No. 2007-137109, dated Apr. 16, 2009.
Office Action for EU Application No. EP 08251487, dated Apr. 20, 2010.
Search Report of EU Application No. EP 08251487, dated Mar. 30, 2010.

\* cited by examiner

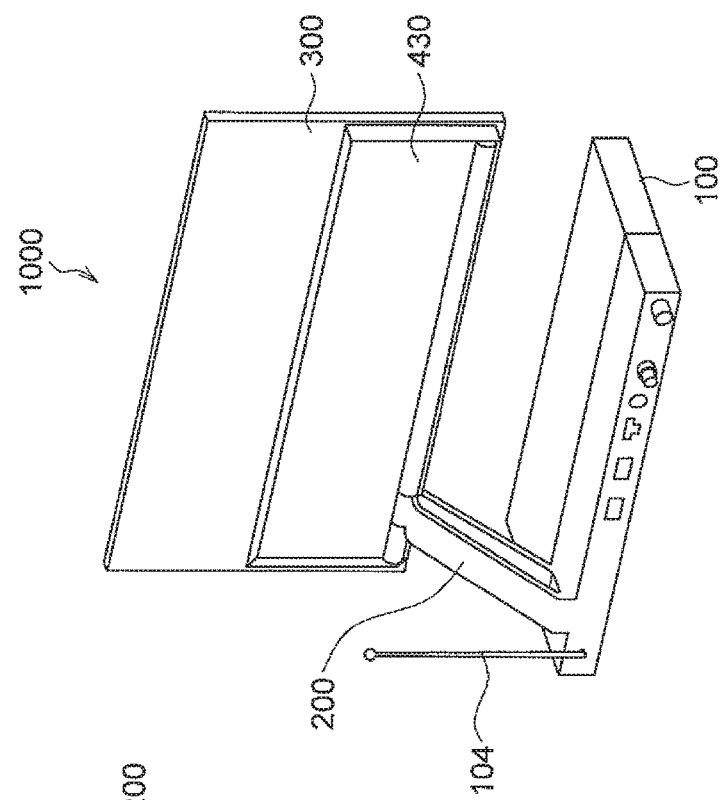
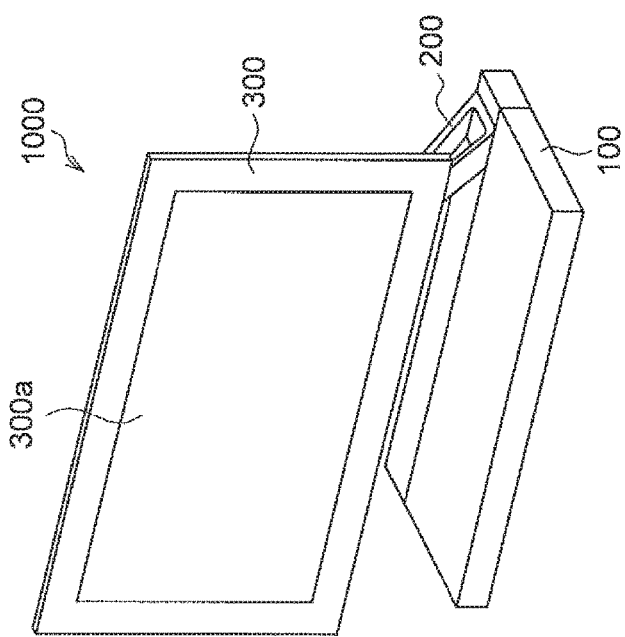

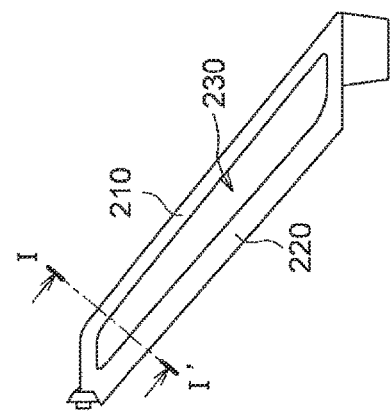
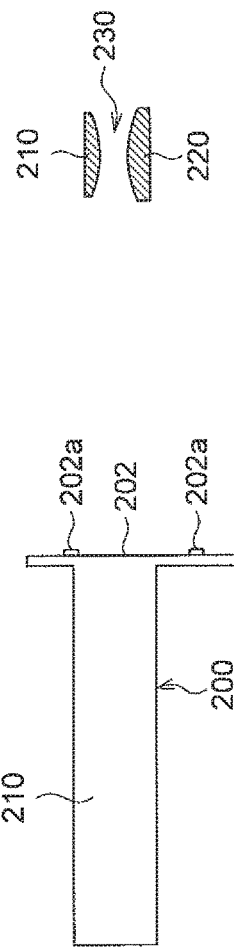
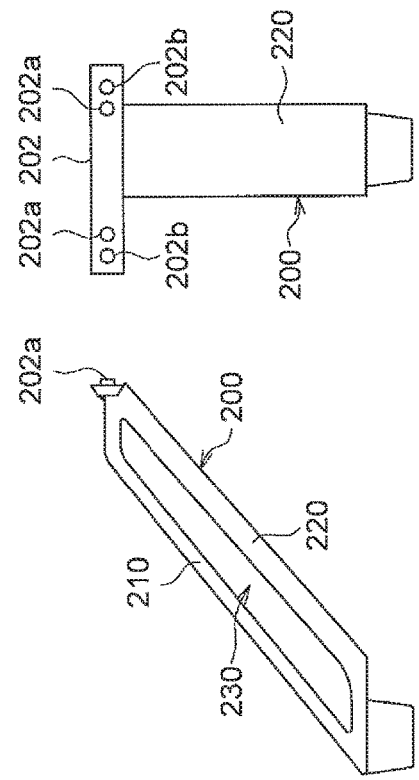
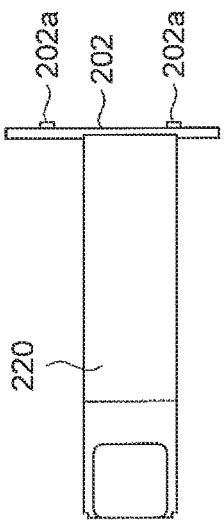
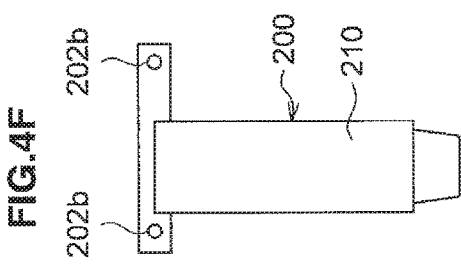

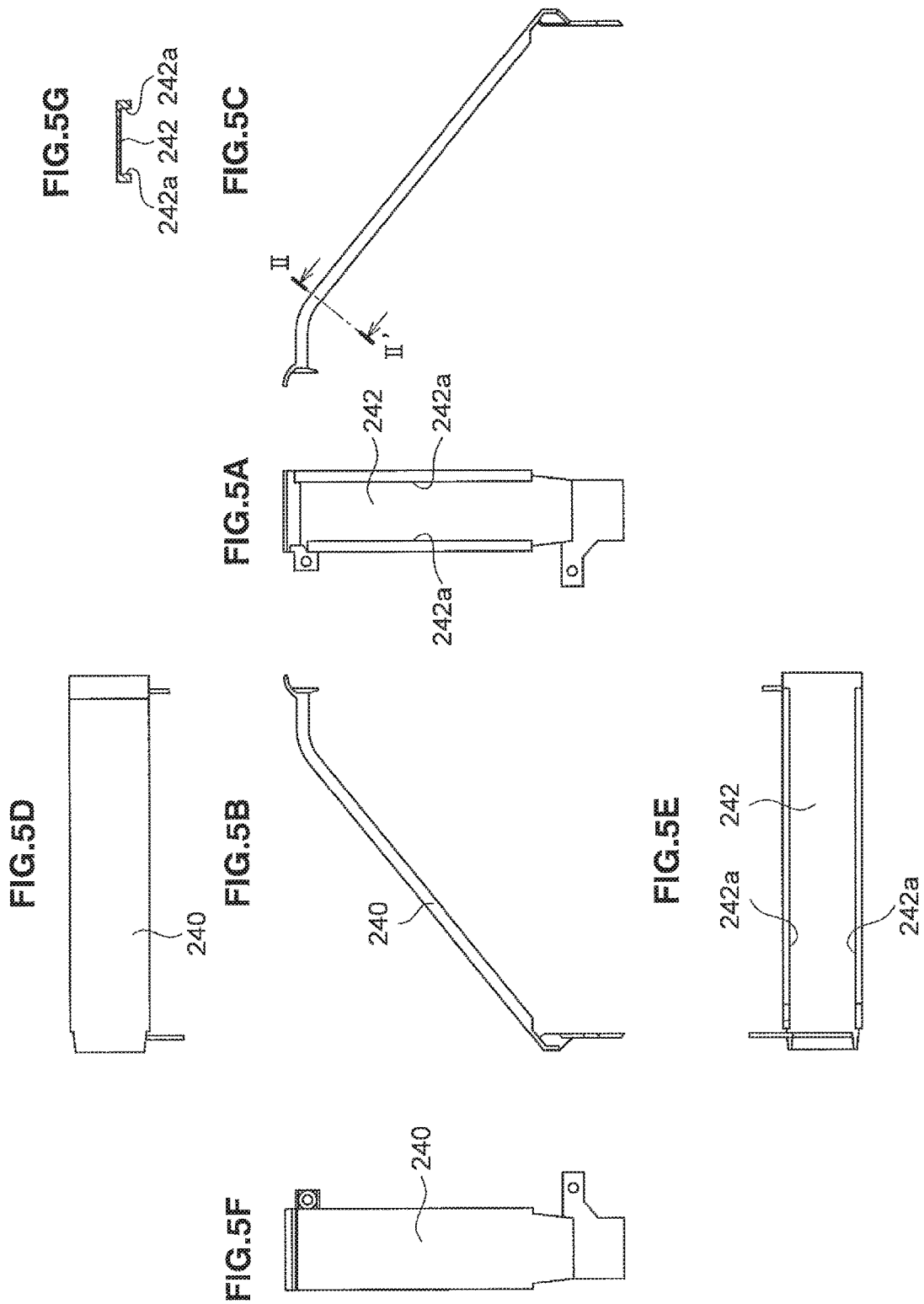

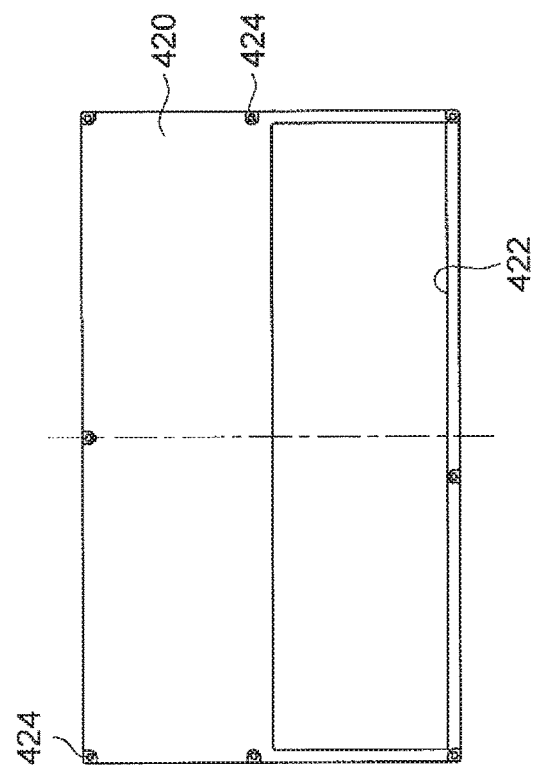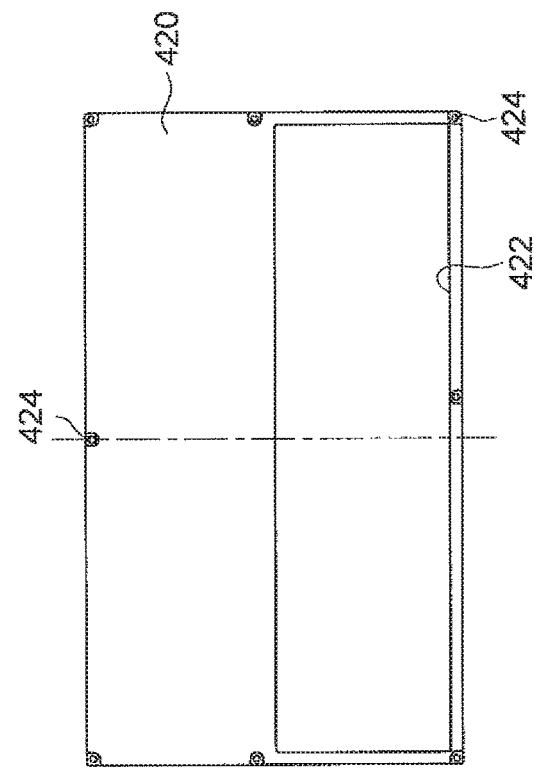

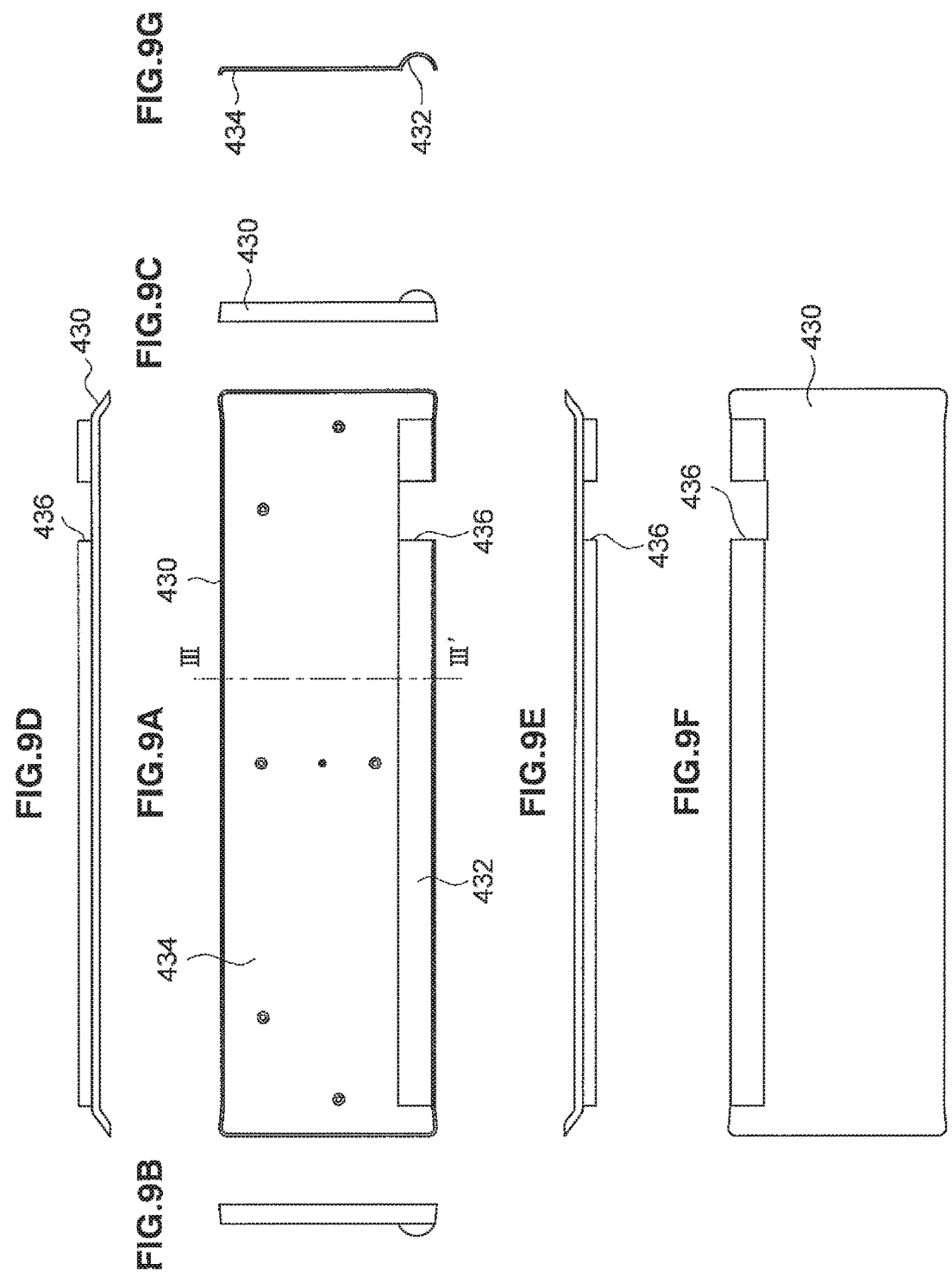

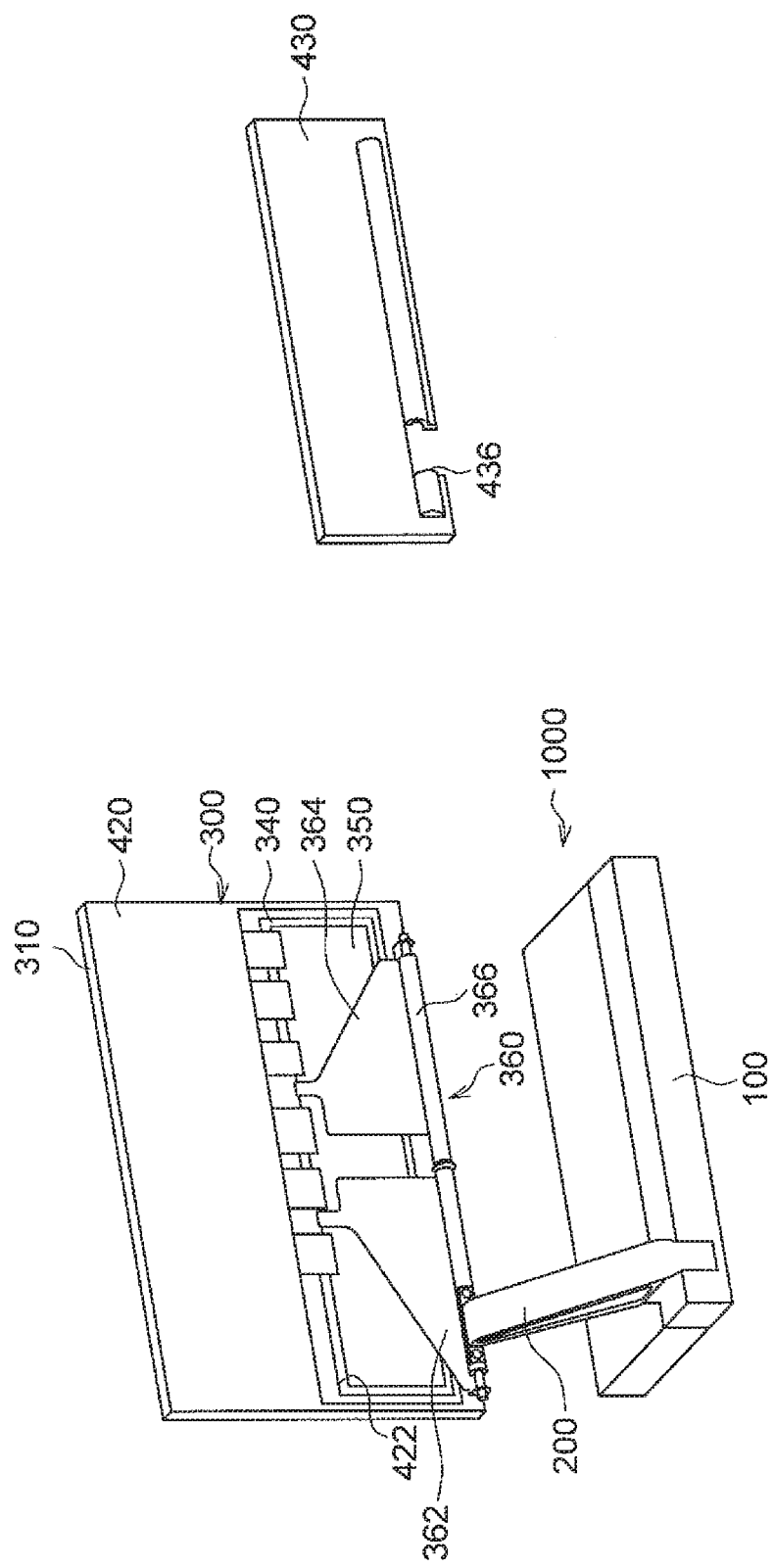

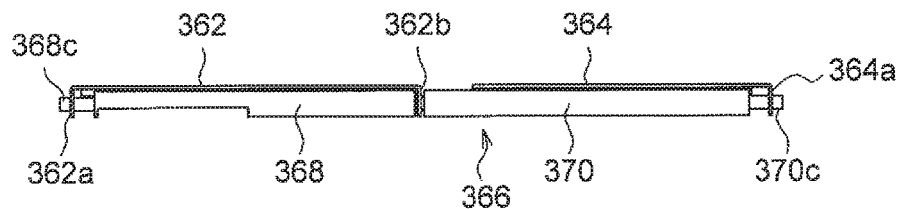
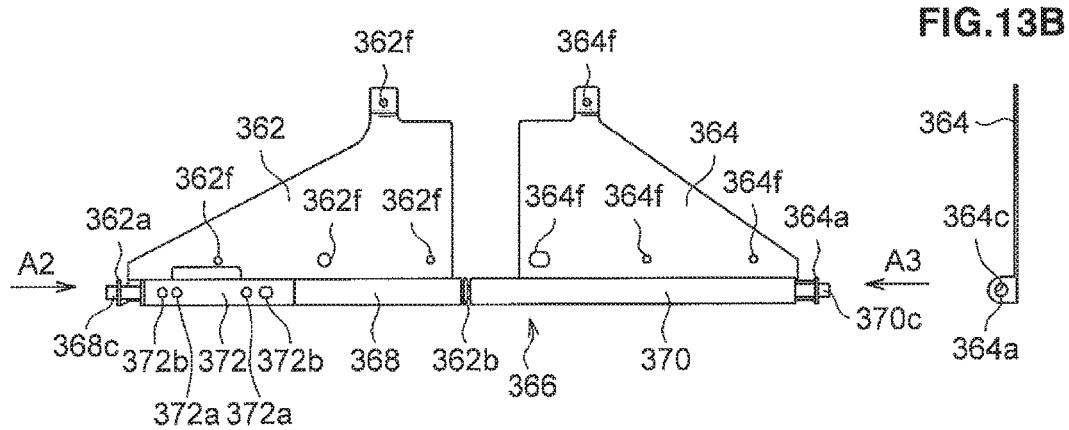
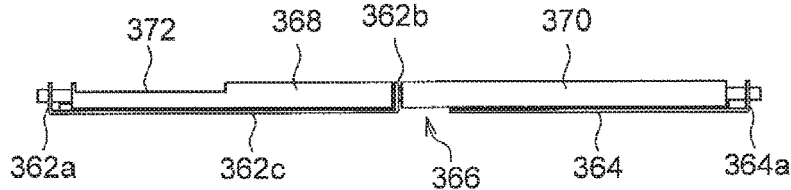
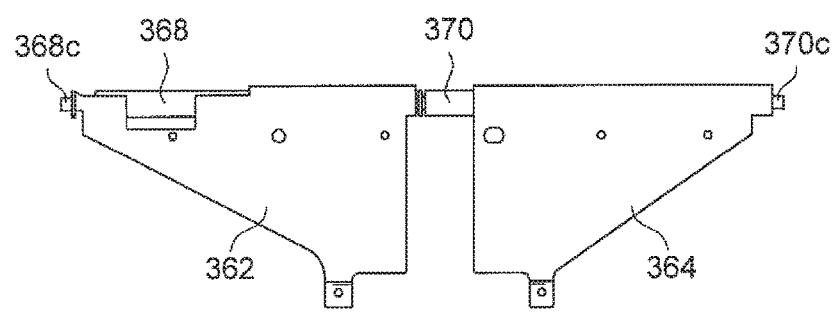

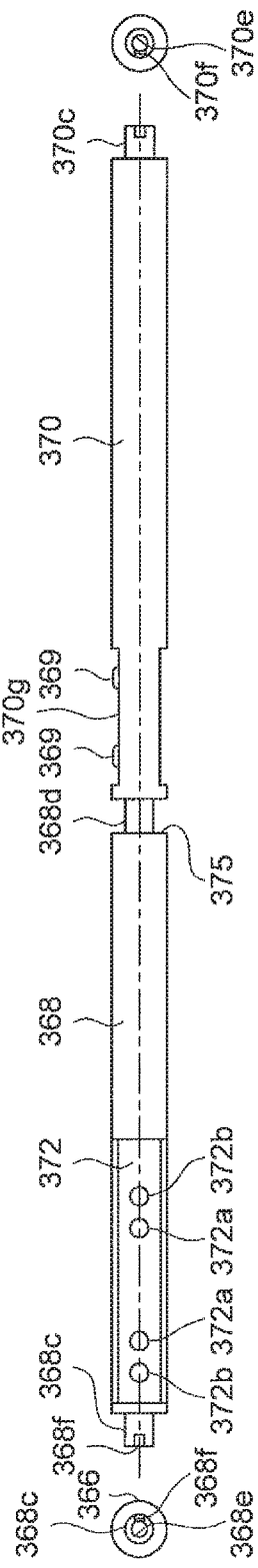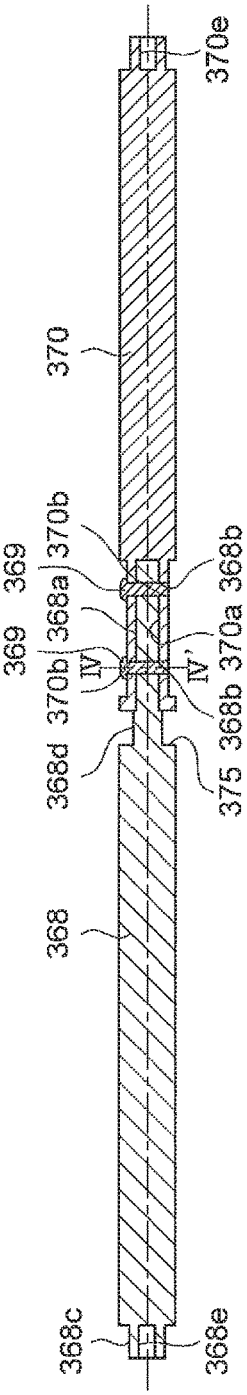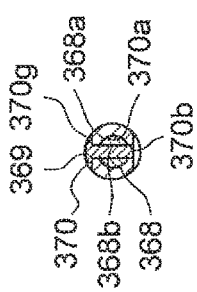

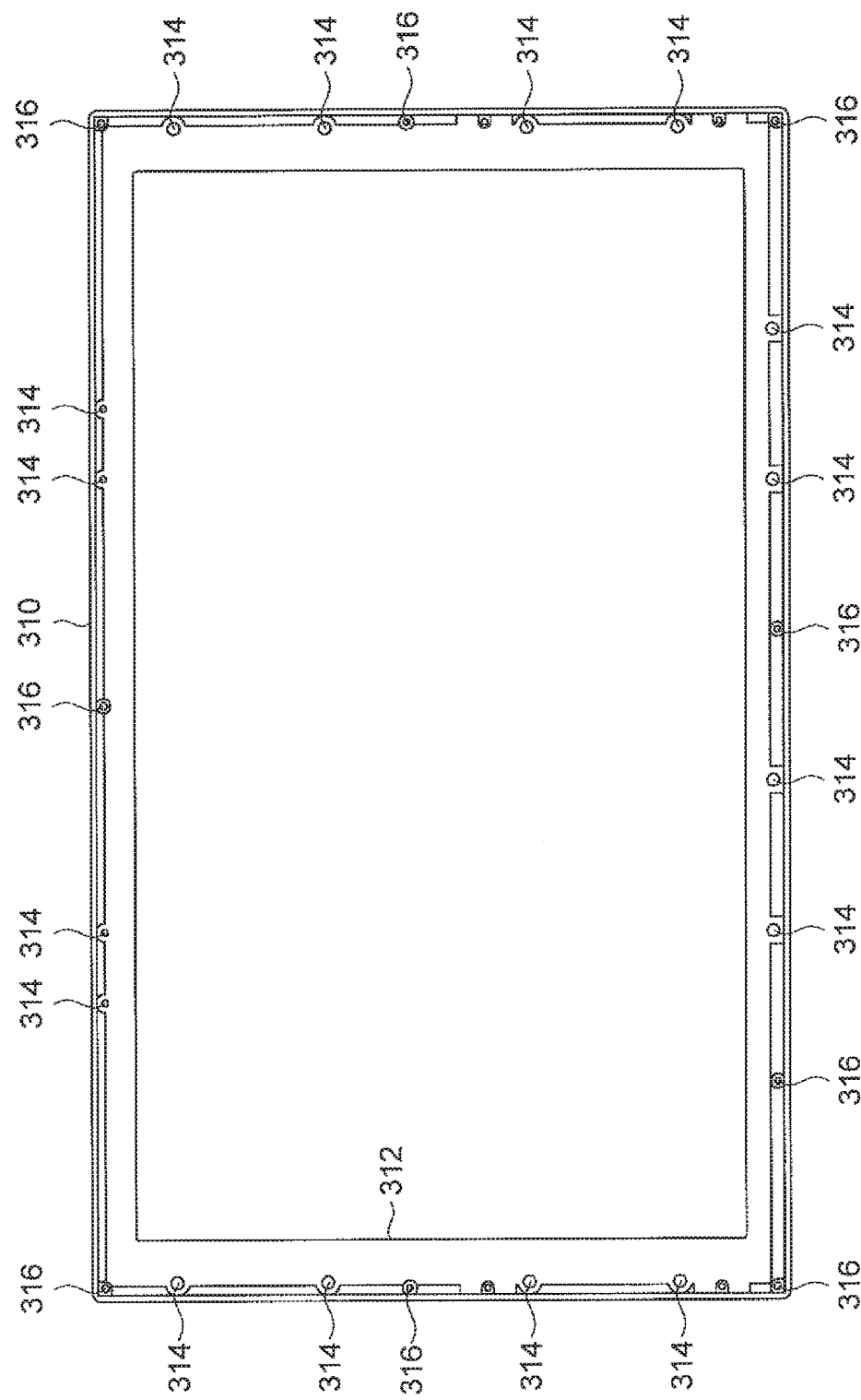

DISPLAY DEVICE

CROSS-REFERENCE TO RELATED APPLICATIONS

The present application is a continuation application of U.S. patent application Ser. No. 13/923,825, filed Jun. 21, 2013, which is a continuation application of U.S. application Ser. No. 12/125,257 filed May 22, 2008, now U.S. Pat. No. 8,493,723, which claims the benefit of priority from prior Japanese Priority Patent Application JP 2007-137109 filed in the Japan Patent Office on May 23, 2007, the entire content of which is hereby incorporated by reference.

BACKGROUND OF THE INVENTION

Field of the Invention

The present invention relates to a display device.

Description of the Related Art

In related art, a structure in which a supporting unit for turnably supporting a display panel at both ends of a body unit arranged with a keyboard is arranged, and the display panel is supported at two locations on both ends in the width direction of the display panel is known in a laptop as disclosed in Japanese Patent Application Laid-Open No. 11-102235 as a structure for supporting a display panel arranged with a screen of the display device.

In a liquid crystal display panel etc. of a desktop personal computer, a supporting arm is generally arranged standing upward from the body unit of the liquid crystal panel placed on a table etc., and a central part in the width direction of the liquid crystal panel is supported with the supporting arm.

[Patent document 1] Japanese Patent Application Laid-Open No. 11-102235

SUMMARY OF THE INVENTION

However, since the display device of the related art relates to a structure for supporting the central part or both ends in the width direction of the display panel, the structural portion connecting to the display panel from the body unit by way of the supporting unit inevitably comes into view when the user views the display panel. Thus, for the user, the display panel supporting structure from the display panel to the body unit through the supporting unit comes into view even though the user wants to closely look only at the display screen. Thus, an extra structure comes into the view of the user, and the user is not able to focus and closely look only at the display screen.

If the supporting unit of the display panel is arranged at the central part or both ends of the display panel, the degree of freedom in the arrangement of the supporting unit with respect to the body unit or the display panel lowers, and thus the arrangement of operation buttons becomes limited by the position of the supporting unit when arranging operation buttons on the body unit etc.

The present invention addresses the above-identified issues, and it is desirable to provide a novel and an improved display device capable of reliably recognizing the display content by enabling the user to closely look only at the display screen and suppressing other structures from coming into view as much as possible.

According to an embodiment of the present invention, there is provided, a display device including a body unit, a display unit, and a supporting unit, arranged upright from the body unit, for supporting the display unit; wherein the supporting unit is arranged on either left or right end side from a center in a horizontal direction of the display unit, and the display unit is supported in a cantilever state.

According to such configuration, the display unit is supported by the supporting unit arranged upright from the body unit. The supporting unit is arranged on either left or right end side from the center in the horizontal direction of the display unit, and the display unit is supported by the supporting unit in a cantilever manner. Therefore, the supporting unit does not come into the view of the user, and only the display screen is independently recognized by the user. A sense of feeling that the display screen is floating is evoked on the user, and satisfactory designability can be maintained.

The supporting unit may be connected to either the left or the right end in the horizontal direction of the display unit. According to such configuration, the supporting unit reliably does not come into the view of the user, and only the display screen can be independently recognized by the user.

Furthermore, the supporting unit may be arranged upright at a predetermined position on the body unit on a back surface side of the display unit, and may be arranged inclined towards the display unit with respect to a perpendicular direction. According to such configuration, the supporting unit is hidden behind the display unit, and the supporting unit can be suppressed from being recognized in the view of the user. Therefore, a sense of feeling that the display unit is floating in space can be created to the user, and a display device excelling in floating feeling and lightness can be provided.

Moreover, the supporting unit may be arranged inclined by an angle of greater than or equal to 45 degrees with respect to the perpendicular direction. According to such configuration, the supporting unit can be more reliably hidden behind the display unit, and the supporting unit can be avoided from being recognized in the view of the user.

The supporting unit may be arranged upright from a backmost part of the body unit. According to such configuration, the inclination angle of the supporting unit with respect to the perpendicular direction can be increased, and the supporting unit can be hidden behind the display unit.

Furthermore, the supporting unit may support a lower end of the display unit. According to such configuration, the upper part of the display unit can be further thinned.

Moreover, the display unit may be connected by the supporting unit by way of a hinge for turnably supporting the display unit with respect to a center axis of rotation in the horizontal direction. According to such configuration, a tilt position of the display unit can be optimally adjusted, and the display screen can be reliably recognized.

According to the embodiments of the present invention, a display device that enables only the display screen to be closely looked and the display content to be reliably recognized, and that can maintain satisfactory designability is provided.

BRIEF DESCRIPTION OF THE DRAWINGS

FIGS. 1A and 1B are schematic perspective views showing an outer appearance of a display device according to one embodiment of the invention;

FIGS. 4A to 4G are frame format views showing a configuration of the arm unit in detail;

FIGS. 5A to 5G are frame format views showing a configuration of a cover of the arm unit in detail;

FIGS. 8A and 8B are frame format views showing a configuration of a rear cover;

FIGS. 9A to 9G are frame format views showing a configuration of a T-cover;

FIG. 10 is a frame format view showing a state of the display device seen from the rear surface side with the T-cover detached;

FIGS. 13A to 13E are frame format views showing a configuration of the hinge in detail;

FIGS. 14A to 14C are frame format views showing a configuration of a shaft in detail;

FIG. 20 is a frame format view showing the bezel from the rear surface side of the display displaying unit;

DETAILED DESCRIPTION OF THE PREFERRED EMBODIMENTS

Figure 2:
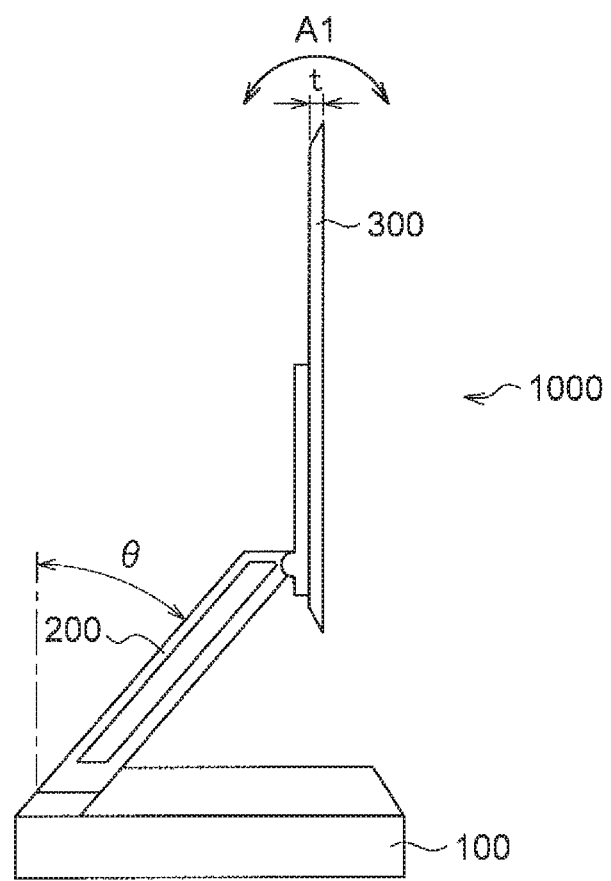
FIG. 2 is a schematic perspective view showing the display device seen from the left on the front surface side.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

[Overall Configuration of Display Device]

FIGS. 1A and 1B are schematic perspective views showing an outer appearance of a display device 1000 according to one embodiment of the present invention. FIG. 1A is a schematic perspective view showing the display device 1000 seen from the upper right on the front surface side. FIG. 1B is a perspective view showing the display device 1000 seen from the upper right on the back surface side of the display device 1000. FIG. 2 is a schematic perspective view showing the display device 1000 seen from the left on the front surface side.

As shown in FIGS. 1A, 1B, and 2, the display device 1000 of the present embodiment is configured to include a body stand unit (body unit) 100, an arm unit (supporting unit) 200, and a display displaying unit (display unit) 300. The display device 1000 receives television broadcast pictures etc., and displays the same on a display screen 300a of the display displaying unit 300.

The display displaying unit 300 includes a display panel (organic EL (electro luminescence) panel) 320 for displaying images using organic EL phenomenon. The organic EL panel 320 is configured to include a plurality of organic EL elements, which are self-emitting elements, and does not include configurations such as backlight, and thus the thickness thereof can be made sufficiently thin. As shown in FIG. 2, the display displaying unit 300 of the present embodiment is a thin panel having a very thin thickness, the thickness t being suppressed to less than or equal to about a few mm (about 3 mm).

The arm unit 200 is arranged at one location on the back side of the body stand unit 100 and is arranged standing upward from the body stand unit 100. The arm unit 200 is arranged more to the right side than the center in the transverse direction (horizontal direction) of the body stand unit 100 when the display device 1000 is seen from the front surface side, and is connected on the right side than the center in the transverse direction of the display displaying unit 300. Thus, in the display device 1000 of the present embodiment, the arm unit 200 is arranged on one of the left or the right side from the center in the horizontal direction of the display displaying unit 300, and the display displaying unit 300 is supported in a cantilever manner. The arm unit 200 may be connected at the end in the horizontal direction of the display displaying unit 300. A cantilever structure may be obtained by connecting the upper end of the arm unit 200 near the center in the horizontal direction of the display displaying unit 300, and connecting the lower end to the end of the body stand unit 100 as shown in FIGS. 1A and 1B.

A backlight is necessary in the case of a liquid crystal display, and thus the thickness of the display displaying unit becomes thicker and the weight becomes heavier. In particular, considering usage for a display of displaying television pictures rather than for a computer display, greater number of backlights is arranged than in the computer display to ensure image quality as a television receiver. In addition to backlights, an inverter for controlling the backlight is also necessary in the liquid crystal display. Thus, in the case of the liquid crystal display, the weight is heavier and the rigidity of the displaying unit including the arm unit is greatly enhanced to support the display displaying unit in a cantilever manner, whereby the structure becomes complicating and the weight becomes heavier. Therefore, it is not realistic to support the liquid crystal display in a cantilever manner in view of convenience of the user, manufacturing cost, and the like.

The organic EL panel is made up of organic EL elements, which are self-emitting elements, and thus does not require backlights and configuration members such as an inverter related thereto, and can be configured light only with the panel made of thin-plate glass. Therefore, according to the present embodiment, the display displaying unit 300 itself can be configured to a very light weight, and the display displaying unit 300 can be supported in a cantilever manner.

The display displaying unit 300 is turnable in the direction of an arrow A1 in FIG. 2 with the coupling part with respect to the arm unit 200 as the center, and the user can set a tilt position of the display displaying unit 300 to a desired angle.

In the display panel of the related art, the member for supporting the display panel supports the central part in the transverse direction of the display panel from the lower side in the case of one-point support. In the case of two-point support, the vicinity of both ends in the transverse direction of the display panel is supported from the lower side. In the present embodiment, the arm unit 200 is arranged shifted from the central part in the transverse direction of the display displaying unit 300 and the display displaying unit 300 is supported in a cantilever manner, and thus the arm unit 200 is out of the view of the user, and the user can independently recognize only the display screen 300a. The user can get an impression as if the display displaying unit 300 is floating on the body stand unit 100 without the arm unit 200. The user then can independently and closely look only at the display screen 300a by supporting the display displaying unit 300 in a cantilever manner.

The degree of freedom in installing the arm unit 200 enhances since there is no need to connect the root of the arm unit 200 to the central part of the body stand unit 100. Thus, the installing position of the arm unit 200 with respect to the body stand unit 100 can be determined in view of the arrangement etc. of the internal structure of the body stand unit 100 and the substrate, and the degree of freedom of design can be enhanced. The configuring members can be arranged in the most efficient manner in view of the internal structure of the body stand unit 100, and the size of the display device 1000 can be suppressed to a minimum. Furthermore, since the arm unit 200 is not arranged at the central part of the body stand unit 100, a wide effective space can be created at the upper surface of the body stand unit 100, and the display part, the operation button, the LED display lamp etc. can be freely arranged on the upper surface of the body stand unit 100.

As shown in FIGS. 1A, 1B, and 2, the arm unit 200 is arranged inclined towards the back surface of the display displaying unit 300 from the rear side of the body stand unit 100. In FIG. 2, an inclination angle θ of the arm unit 200 with respect to a perpendicular direction is about 45 to 60°, When the display displaying unit 300 is viewed from the front surface, the arm unit 200 will be hidden behind the display displaying unit 300, thereby suppressing the arm unit 200 from being recognized in the view of the user. Therefore, the arm unit 200 can be reliably suppressed from being recognized in the view of the user according to the synergetic effect of arranging the arm unit 200 in a shifted manner from the central part of the display displaying unit 300.

The connection state of the display displaying unit 300 and the body stand unit 100 is suppressed from being directly recognized by the user since only the display displaying unit 300 and the body stand unit 100 appear in the view of the user and the arm unit 200 barely comes into view. The user thus feel as if the display displaying unit 300 is floating in space.

In the configuration of the present embodiment, the lightness of the display displaying unit 300 is emphasized and recognized by the user since the thickness of the display displaying unit 300 is very thin or about a few mm. Therefore, for the user, the display displaying unit 300 excelling in floating feeling and lightness is provided by the synergetic effect with the feeling as if the display displaying unit 300 is floating in space.

The user then can closely look at only the display content of the display displaying unit 300, which is recognized as if floating in space, and can concentrate on the display content without being distracted by other structures. A display device 1000 in which a satisfactory designability can be maintained while creating a feeling the display screen 300a is floating to the user, and in which the visibility of the display screen 300a is greatly enhanced can be provided.

[Configuration of Arm Unit]

Figure 3:
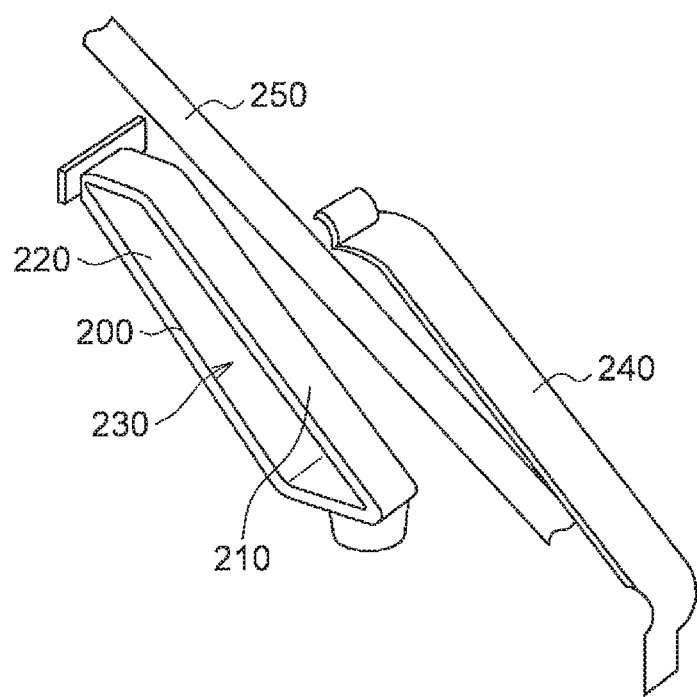
FIG. 3 is a frame format view showing a configuration of an arm unit.

FIG. 3 is a frame format view showing a configuration of the arm unit 200. As shown in FIG. 3, an opening 230 passing through the side face is formed in the arm unit 200 along the longitudinal direction thereof to have a hollow structure. According to such hollow structure, the arm unit 200 is configured by a first arm unit 210 positioned on the upper part, and a second arm unit 220 positioned on the lower part. The first arm unit 210 and the second arm unit 220 are configured to a thin flat plate shape and are arranged facing each other with the opening 230 interposed in between, and the thickness of the first arm unit 210 and the second arm unit 220 are suppressed to a minimum.

As described above, the display displaying unit 300 is very thin and is configured to excel in lightness and floating feeling. Therefore, with respect to the arm unit 200 for supporting the display displaying unit 300, a configuration excelling in lightness and floating feeling is obtained similar to the display displaying unit 300 by suppressing the thickness to a minimum with the hollow structure, and lightness and floating feeling can be emphasized for the display device 1000 as a whole.

Since the weight of the liquid crystal display is heavy, it is difficult to have the arm unit as a hollow structure to obtain lightness and airiness in order to ensure strength. In the present embodiment, the necessary strength can be ensured even if the arm unit 200 has a hollow structure since the display displaying unit 300 is configured by the organic EL panel 320. Therefore, the display displaying unit 300 can be reliably supported, and a satisfactory designability excelling in lightness and airiness can be ensured.

A cover 240 is placed over the upper surface of the first arm unit 210. A flexible print substrate 250 for electrically connecting the body stand unit 100 and the display displaying unit 300 is incorporated between the upper surface of the first arm unit 210 and the cover 240.

FIGS. 4A to 4G are frame format views showing the configuration of the arm unit 200 in detail. FIG. 4A is a front view of the arm unit 200 seen from the front surface side of the display displaying unit 300, FIG. 4B is a left side view, FIG. 4C is a right side view, FIG. 4D is a top view, FIG. 4E is a bottom view, FIG. 4F is a rear view, and FIG. 4G is a cross sectional view taken along a chain dashed line I-I' in FIG. 4C. The body of the arm unit 200 with the cover 240 detached can be configured as an integrated block through casting or machining with metal such as aluminum as the raw material.

FIGS. 5A to 5G are frame format views showing a configuration of the cover 240 in detail. FIG. 5A is a front view of the cover 240 seen from the front surface side of the display displaying unit 300, FIG. 5B is a left side view, FIG. 5C is a right side view, FIG. 5D is a top view, FIG. 5E is a bottom view, FIG. 5F is a rear view, and FIG. 5G is a cross sectional view taken along a chain dashed line II-II' in FIG. 5C. As shown in FIGS. 5A to 5G, the cover includes a concave part 242, and sides walls 242a on both sides of the concave part 242 fit into the side faces in the width direction of the first arm unit 210. The flexible print substrate 250 is arranged between the first arm unit 210 and the cover 240 while being accommodated at the bottom of the concave part 242. The flexible print substrate 250 thus is not exposed to the outside.

The weight of the display displaying unit 300 can be suppressed to a minimum, and the necessary strength can be ensured even if the arm unit 200 has a hollow structure by configuring the display displaying unit 300 with the organic EL panel 320. The display displaying unit 300 configured to be light and thin is obtained, and floating feeling and airiness can be evoked on the user by having the arm unit 200 as a hollow structure and suppressing the volume of the arm unit 200 to a minimum. A structure that prevents the user from being aware of the existence of the wiring is obtained by incorporating the flexible print substrate 250 in the first arm unit 210.

The arm unit 200 may be made of transparent resin material such as polycarbonate and acryl, transparent glass, or the like. A structure that prevents the user from being aware of the existence of the arm unit 200 can be further obtained by having the arm unit 200 transparent. Therefore, the user can look at the display screen 300a, and further floating feeling and airiness of the display device 1000 can be evoked on the user.

[Configuration of Display Displaying Unit]

Figure 6:
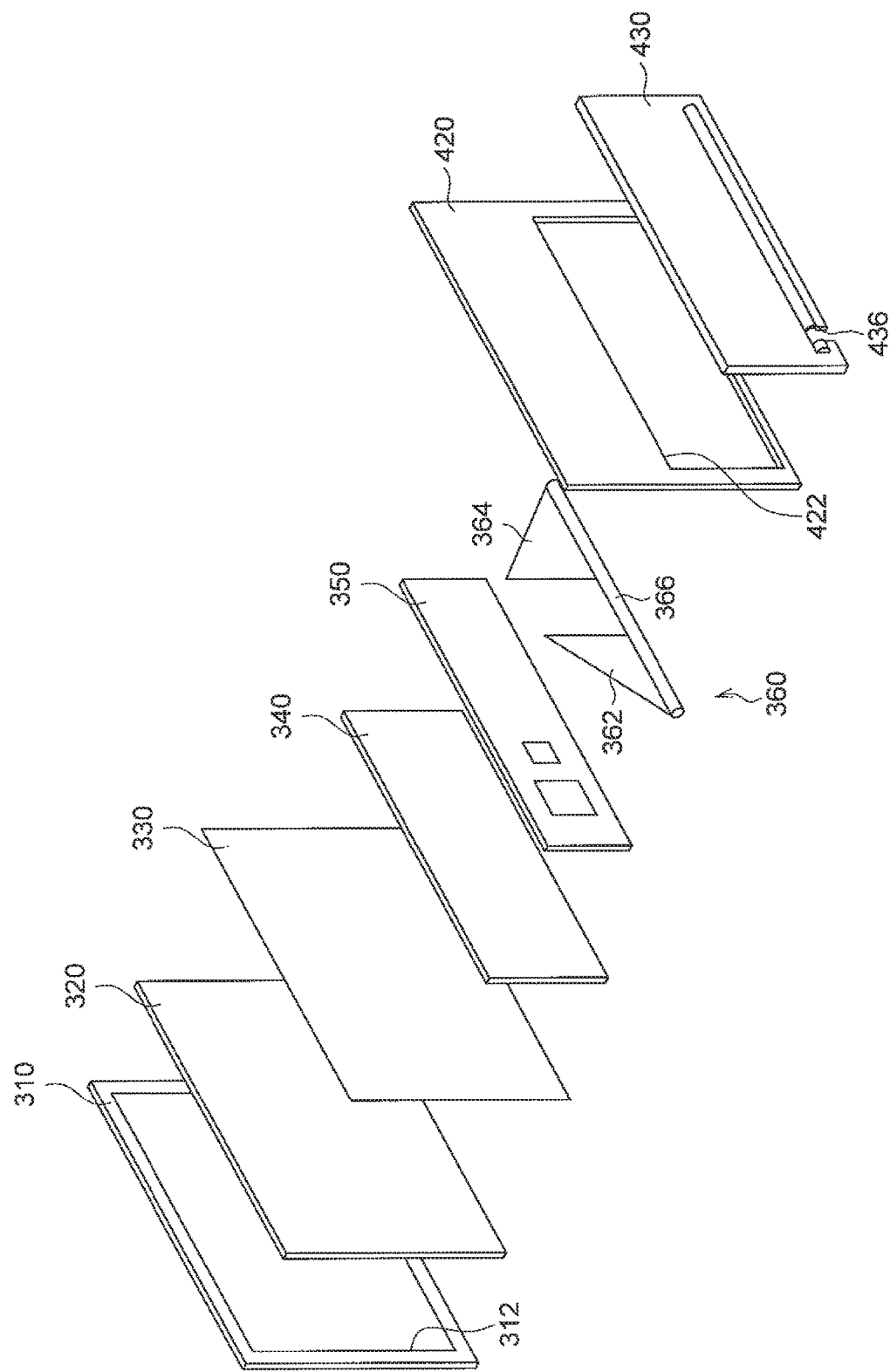
FIG. 6 is an exploded perspective view showing a configuration of a display displaying unit.

FIG. 6 is a frame format view showing a configuration of the display displaying unit 300, and shows an exploded perspective view of the display displaying unit 300. As shown in FIG. 6, the display displaying unit 300 is configured to include a bezel 310, the organic EL panel 320, a graphite sheet 330, a base plate 340, a T-substrate 350, a hinge 360, a rear cover 420, and a T-cover 430.

The base plate 340 is a member that constitutes the main frame of the display displaying unit 300, where the arm unit 200 is coupled to the base plate 340 by way of the hinge 360. The main configuring members such as the organic EL panel 320, the T-substrate 350, and the hinge 360 are fixed with respect to the base plate 340. The main members configuring the display displaying unit 300 such as the organic EL panel 320, the T-substrate 350, the hinge 360, the rear cover 420, and the T-cover 430 are all attached with the base plate 340 as a reference.

The graphite sheet 330 is attached to the back surface of the organic EL panel 320. The organic EL panel 320 is fixed to the base plate 340 through adhesive tape with the surface attached with the graphite sheet 330 facing the base plate 340.

The T-substrate 350 is made of hard substrate, and is connected with the power supply line and the signal line connecting with the organic EL panel 320. The size of the T-substrate 350 corresponds to the size of the base plate 340, and the T-substrate 350 is fixed on the side opposite to the surface fixed with the organic EL panel 320 with respect to the base plate 340.

The hinge 360 is a configuring member for coupling the arm unit 200 and the base plate 340. The hinge 360 is configured to include configuring members such as a first hinge plate 362 and a second hinge plate 364 made of metal and having a triangular plan shape, a shaft 366 made of metal, and the like. The shaft 366 is arranged horizontally along the lower end of the display displaying unit 300. The first hinge plate 362 and the second hinge plate 364 are fixed with respect to the base plate 340, and are turnably attached with respect to the shaft 366. The shaft 366 is fixed with respect to the arm unit 200. Therefore, the base plate 340 can turn with respect to the shaft 366 fixed to the arm unit 200, in which case the center axis of rotation becomes the center axis of the shaft 366. Thus, the display displaying unit 300 can be turned in the direction of the arrow A1 in FIG. 2, and the tilt angle of the display displaying unit 300 can be varied.

The bezel 310 is a member that is attached at the edge of the organic EL panel 320, and that constitutes the outer appearance of the edge of the display displaying unit 300. The rear cover 420 and the T-cover 430 are metal covers that cover the back surface of the display displaying unit 300. The rear cover 420 has an opening 422 formed at a portion corresponding to the position of the T-substrate 350 and the hinge 360, and mainly covers the upper part of the back surface of the display displaying unit 300. The T-cover 430 is configured to be attached in correspondence to the position of the opening 422 so as to cover the T-substrate 350 and the hinge 360.

The base plate 340, the T-substrate 350, and the hinge 360 are all arranged only at the region of less than half of the lower side of the display displaying unit 300, and the area occupied by the base plate 340, the T-substrate 350, and the hinge 360 with respect to the area of the entire display displaying unit 300 is suppressed to a minimum. Other than the region arranged with the base plate 340, the T-substrate 350, and the hinge 360, only three members of mainly the organic EL panel 320, the graphite sheet 330, and the rear cover 420 define the thickness of the display displaying unit 300. Therefore, in the region including the upper half of the display displaying unit 300, in particular, the thickness of the display displaying unit 300 can be very thin, and the thickness can be suppressed to about 3 mm, as described above.

Since the display device 1000 is normally placed on the table etc., the user rarely sees the display displaying unit 300 from the lower side, and the thickness of the display displaying unit 300 is recognized from the upper side. Therefore, the thinness of the display displaying unit 300 can be emphasized to the user by arranging the members such as the base plate 340, the T-substrate 350, and the hinge 360 on the lower side of the display displaying unit 300, and suppressing the thickness on the upper side of the display displaying unit 300 to a minimum. Therefore, a satisfactory designability can be maintained while creating a floating feeling and airiness as described above.

Figure 7A:
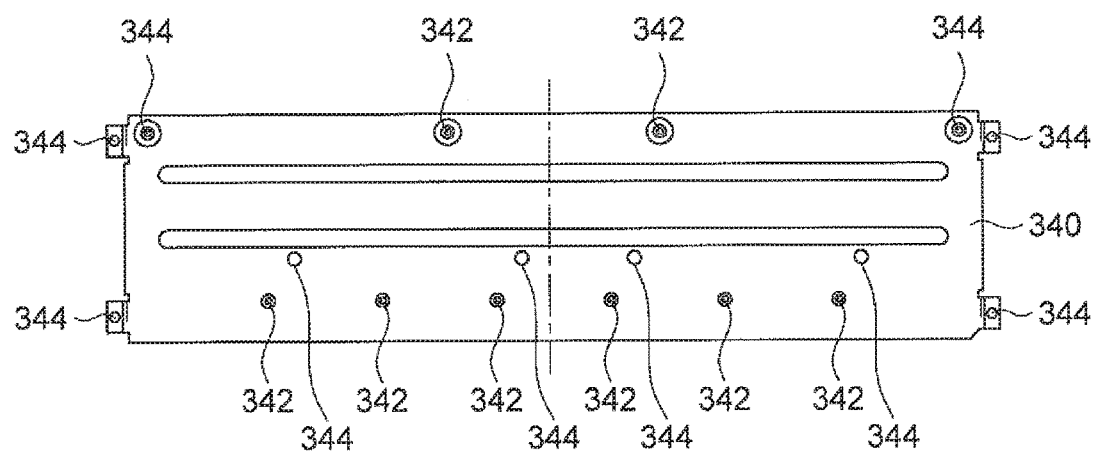
FIGS. 7A to 7C are plan views showing a configuration of a base plate.
Figure 7B:
Figure 7C:
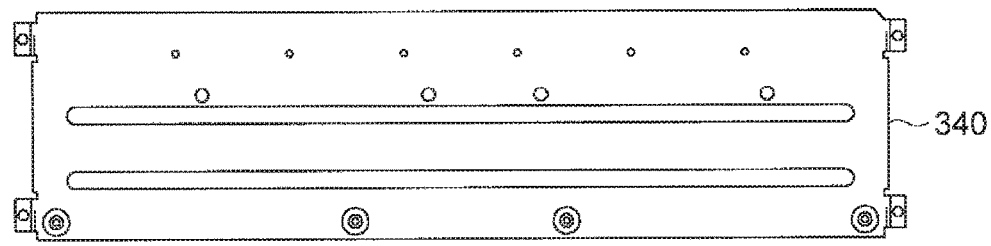

FIGS. 7A to 7C are plan views showing a configuration of the base plate 340. FIG. 7A is a front view of the base plate 340 seen from the rear surface side of the display displaying unit 300, FIG. 7B is a bottom view of FIG. 7A, and FIG. 7C is rear view of FIG. 7A. The base plate 340 is configured from a press molded metal plate. As shown in FIGS. 7A to 7C, a plurality of screw holes 342, 344 is formed in the base plate 340. The screw hole 342 is used to fix the first hinge plate 362 and the second hinge plate 364. The other screw hole 344 is used to fixe components of the display displaying unit 300 such as the T-substrate 350 and the T-cover 430.

The bezel 310 is fixed to the periphery of the organic EL panel 320 through adhesion. As shown in FIG. 6, an opening 312 for exposing the display screen 300a of the organic EL panel 320 is formed in the bezel 310.

FIGS. 8A and 8B are frame format views showing a configuration of the rear cover 420. FIG. 8A is a front view of the rear cover 420 seen from the front surface side of the display displaying unit 300, and FIG. 8B is a rear view of the rear cover 420 seen from the rear surface side of the display displaying unit 300.

FIGS. 9A to 9G are frame format views showing a configuration of the T-cover 430. FIG. 9A is a front view of the T-cover 430 seen from the front surface side of the display displaying unit 300, FIG. 9B is a left side view, FIG. 9C is a right side view, FIG. 9D is a top view, FIG. 9E is a bottom view, FIG. 9F is a rear view, and FIG. 9G is a cross sectional view taken along a chain dashed line III-III' in FIG. 9A.

As shown in FIGS. 8A and 8B, an opening 422 is formed in the rear cover 420 in correspondence to the position of the base plate 340, the T-substrate 350, and the hinge 360. A pass-through hole 424 for inserting the screw to fix the rear cover 420 is formed in the rear cover 420. The rear cover 420 is fixed with respect to the bezel 310, as described later, to cover the upper part of the rear surface side of the organic EL panel 320.

FIG. 10 shows a state of the display device 1000 seen from the rear surface side with the T-cover 430 detached. The base plate 340, the T-substrate 350, and the hinge 360 are arranged in the region on the lower side of the display displaying unit 300, where the T-substrate 350 and the hinge 360 are exposed to the outside from the opening 422 of the rear cover 420 with the T-cover 430 detached.

As shown in FIGS. 9A to 9G, the T-cover 430 includes a concave part 432 corresponding to the shaft 366 of the hinge 360, and a concave part 434 corresponding to a region arranged with the base plate 340, the T-substrate 350, the first hinge plate 362, and the second hinge plate 364. A cutout 436 is formed in the T-cover 430 at a position corresponding to the arm unit 200.

When the T-cover 430 is placed over the rear cover 420, the shaft 366 is accommodated in the concave part 432, and the T-substrate 350, the first hinge plate 362, and the second hinge plate 364 are accommodated in the concave part 434. Thus, the configuring members such as the T-substrate 350 and the hinge 360 are covered with the T-cover 430, as shown in FIG. 1B. The arm unit 200 is projected towards the back side from the cutout 436 of the T-cover 430.

Therefore, only the rear cover 420, the T-cover 430, and the arm unit 200 are exposed to the outside at the rear surface side of the display displaying unit 300, and a very simple and sophisticated outer appearance can be obtained. In particular, the display displaying unit 300 that is very thin and that has a floating feeling and lightness can be configured since the configuring members related to thickness at the upper side of the display displaying unit 300 are mainly three members of the organic EL panel 320, the graphic sheet 330, and the rear cover 420. The display displaying unit 300 having sufficient strength while being very thin can be configured since the base plate 340 is a rigid member of the display displaying unit 300 and the main components of the display displaying unit 300 are fixed with respect to the base plate 340.

[Configuration of Hinge]

Figure 11:
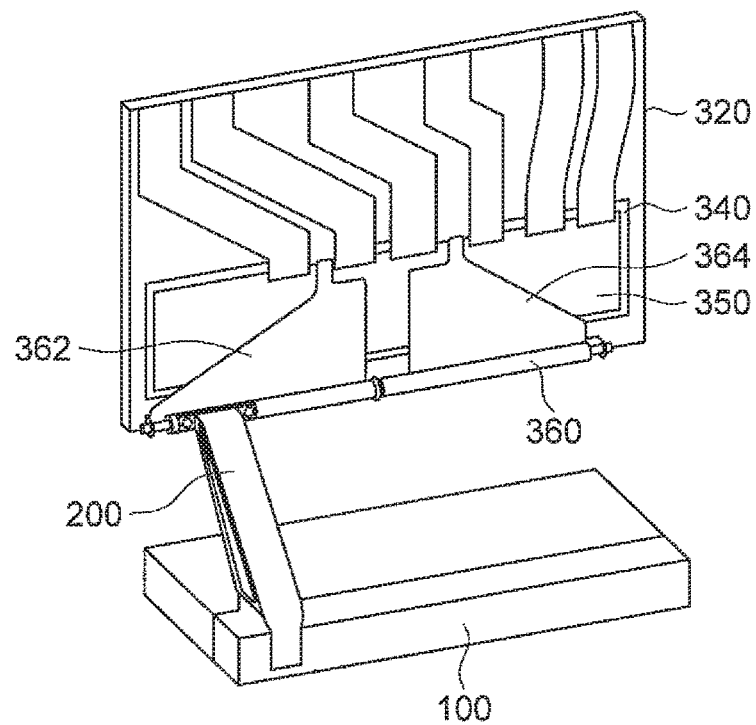
FIG. 11 is a frame format view showing a state in which members such as rear cover and bezel are detached from the state of FIG. 10.
Figure 12:
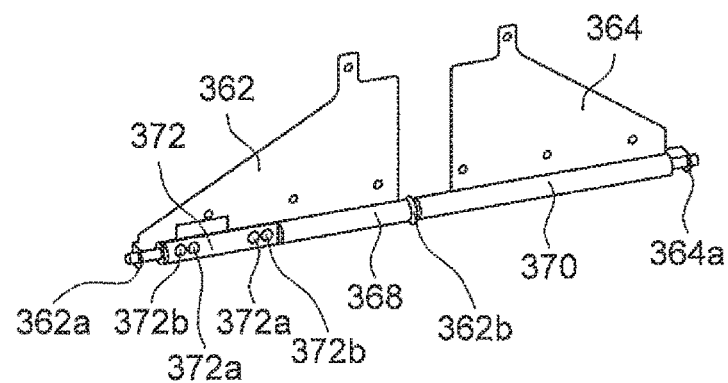
FIG. 12 is a perspective view showing a configuration of a hinge.

FIG. 11 is a view showing a state of the display device 1000 seen from the rear surface side, showing a state in which the members such as the rear cover 420 and the bezel 310 are detached from the state of FIG. 10. FIG. 12 is a perspective view showing a configuration of the hinge 360.

FIGS. 13A to 13E are frame format views showing a configuration of the hinge 360 in detail. FIG. 13A is a front view of the hinge 360 seen from the rear surface side of the display displaying unit 300, FIG. 13B is a right side view, FIG. 13C is a top view, FIG. 13D is a bottom view, and FIG. 13E is a rear view.

The shaft 366 of the hinge 360 is fixed with respect to the arm unit 200. As shown in FIGS. 4A to 4G, a receiving surface 202 to be attached with the shaft 366 is arranged at the distal end of the upper part of the arm unit 200. A boss 202a and a hole 202b are formed in the receiving surface 202.

As shown in FIG. 12, a flat surface 372 is formed at one part of the outer peripheral surface of the shaft 366. The flat surface 372 is formed with a hole 372a to be inserted with the boss 202a of the receiving surface 202 of the arm unit 200. The flat surface 372 is formed with a screw hole 372b at a position corresponding to the hole 202b.

The flat surface 372 contacts the receiving surface 202 of the arm unit 200, and the boss 202a is inserted to the hole 372a. In this state, the screw is inserted to the hole 202b from the back side of the arm unit 200 and screwed into the screw hole 372b so that the shaft 366 is fixed to the arm unit 200. As shown in FIG. 11, the shaft 366 of the hinge 360 and the arm unit 200 are integrated. The integrated shaft 366 and the arm unit 200 become a rigid member that supports the display displaying unit 300.

The shaft 366 is arranged horizontally along the lower side of the display displaying unit 300. The first hinge plate 362 and the second hinge plate 364 are turnably engaged to the shaft 366 with the shaft 366 as the center axis of rotation.

As shown in FIG. 13A, a plurality of holes 362f is formed in the first hinge plate 362. A plurality of holes 364f is formed in the second hinge plate 364. The holes 362f, 364f correspond to the position of the screw hole 342 of the base plate 340, and the first hinge plate 362 and the second hinge plate 364 are fixed with respect to the base plate 340 with the T-substrate 350 interposed in between the base plate 340 by screwing in the screw inserted to the holes 362f, 364f to the screw hole 342 of the base plate 340. The first hinge plate 362 and the second hinge plate 364 thereby become strength members for ensuring the rigidity of the display displaying unit 300 with the base plate 340.

FIGS. 14A to 14C are frame format views showing a configuration of the shaft 366 in detail. FIG. 14A is a front view showing the shaft 366 from the rear surface side of the display displaying unit 300, the right side view, and the left side view. FIG. 14B is a cross section taken along the center axis of the shaft 366. FIG. 14C is a cross section taken along a chain dashed line IV-IV' in FIG. 14A.

As shown in FIGS. 14A to 14C, the shaft 366 is divided at the middle to include two shafts 368 and 370. The above-described flat surface 372 is arranged on the shaft 368.

As shown in FIGS. 14A and 14B, a groove 375 is formed at a portion where the shaft 368 and the shaft 370 are coupled. An engagement shaft 368a to be inserted to an engagement hole 370a of the shaft 370 is arranged at the end of the shaft 368. The flat surface 370g is formed at the end of the shaft 370.

As shown in FIG. 14B, two holes 368b to be inserted with a pin 369 are formed at the engagement shaft 368a of the shaft 368. Two holes 370b to be inserted with the pin 369 are formed at the portion where the flat surface 370g of the shaft 370 is formed.

The shaft 368 and the shaft 370 are fixed by inserting and caulking the pin 369 to the hole 368b and the 370b with the engagement shaft 368a inserted to the engagement hole 370a. In this case, the outer diameter of the pin 369 and the inner diameter of the hole 368b and the hole 370b are fitted and fixed by caulking.

As shown in FIG. 14A, an engagement shaft 368c is arranged at the end of the shaft 368 on the side opposite to the engagement shaft 368a. The engagement shaft 368d is arranged at the position of the groove 357. A hole 368e of a predetermined depth is formed along the center axis in the engagement shaft 368c. An engagement groove 368f of a predetermined depth is formed at one part of the end face of the engagement shaft 368c.

Similarly, an engagement shaft 370c is arranged at the end of the shat 370. A hole 370e of a predetermined depth is formed along the center axis in the engagement shaft 370c. An engagement groove 370f of a predetermined depth is formed at one part of the end face of the engagement shaft 370c.

As shown in FIGS. 12, and 13A to 13E, two engagement parts 362a, 362b that engage with the engagement shafts 368c, 368d at both ends of the shaft 368 are formed at both ends of the first hinge part 362 through bend processing. A pass-through hole 362c (not shown in FIGS. 12, and 13A to 13E) is formed in the engagement parts 362a, 362b.

One engagement part 364a that engages the engagement shaft 370c arranged at one end of the shaft 370 is formed at one end of the second hinge plate 364 through bend processing. As shown in FIG. 13B, a pass-through hole 364c is formed in the engagement part 364a.

Figure 15A:
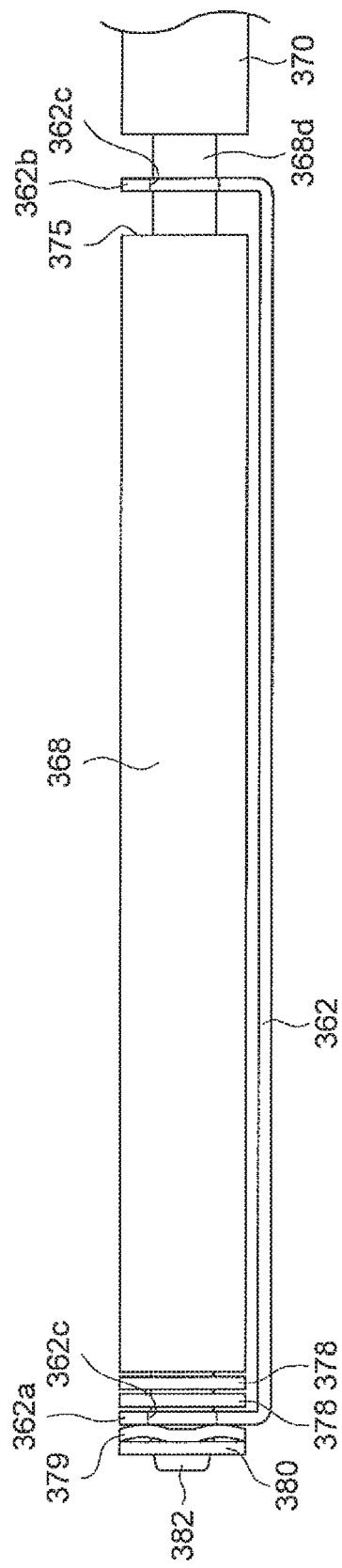
FIGS. 15A and 15B are frame format views showing an engagement state of a first hinge plate and a second hinge plate, and the shaft.
Figure 15B:
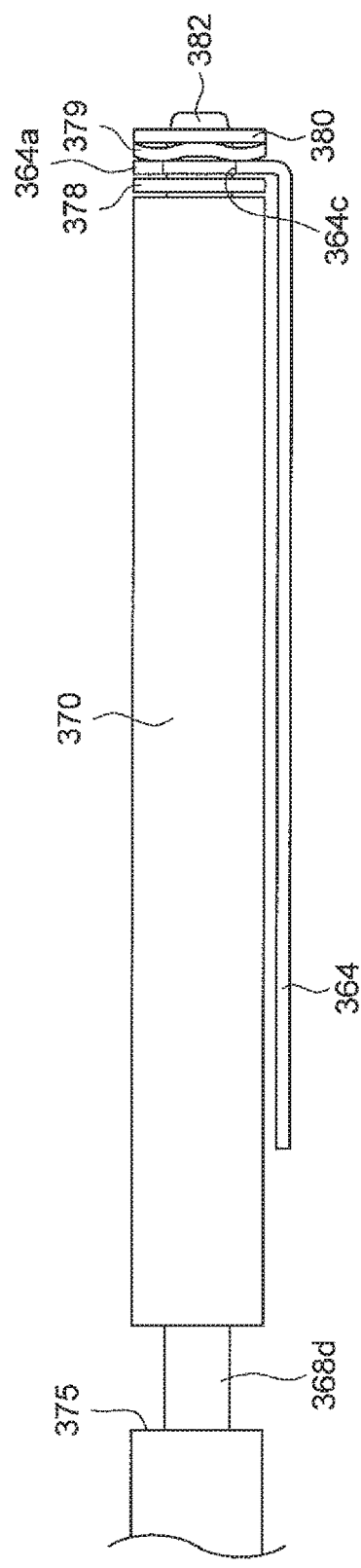

FIGS. 15A and 15B are frame format views showing an engagement state of the first hinge plate 362 and the second hinge plate 364, and the shaft 366, showing the shaft 366 from the lower side of the display displaying unit 300. FIG. 15A shows a state in which the first hinge plate 362 is turnably attached to the shaft 366. FIG. 15B shows a state in which the second hinge plate 364 is turnably attached to the shaft 366.

As shown in FIG. 15A, the pass-through hole 362c of the engagement part 362a of the first hinge part 362 is inserted to the engagement shaft 368c of the shaft 368 with a washer 378 inserted to the engagement shaft 368c. The pass-through hole 362c of the engagement part 362b is inserted to the engagement shaft 368d. A lock position regulating plate 380 is attached to the distal end of the engagement shaft 368c with a spring washer 379 inserted to the engagement shaft 368c, and a caulking pin 382 is pushed into the hole 368e thereby fixing the caulking pin 382 to the hole 368e. The lock position regulating plate 380 is fixed at the distal end face of the engagement shaft 368c, and the first hinge plate 362 is turnably attached to the shaft 368.

As shown in FIG. 15B, the pass-through hole 364c of the engagement part 364a of the second hinge plate 364 is inserted to the engagement shaft 370c with a washer 378 inserted to the engagement shaft 370c, and a spring washer 379 is inserted to the engagement shaft 370c. The lock position regulating plate 380 is attached to the distal end of the engagement shaft 370c, and the caulking pin 382 is pushed into the hole 370e thereby fixing the caulking pin 382 to the hole 370e. The lock position regulating plate 380 is fixed at the distal end face of the engagement shaft 370c, and the second hinge plate 364 is turnably attached to the shaft 370.

When assembling the hinge 360, the pass-through hole 362c of the engagement part 362b of the first hinge plate 362 is first inserted to the engagement shaft 368d of the shaft 368 with the shaft 366 separated into the shaft 368 and the shaft 370. The washer 378 is inserted to the engagement shaft 368c, and the pass-through hole 362c of the engagement part 362a is inserted to the engagement shaft 368c.

The engagement shaft 368a of the shaft 368 is inserted to the engagement hole 370a of the shaft 370, the pin 369 is inserted and caulked to the hole 368b and the hole 370b to fix and integrate the shaft 368 and the shaft 370. A groove 375 is formed between the shaft 368 and the shaft 370, and the engagement part 362b is engaged with the engagement shaft 368d in the groove 375.

The washer 378 is then inserted to the engagement shaft 370c of the shaft 370, and the pass-through hole 364c of the engagement part 364a of the second hinge part 364 is inserted to the engagement shaft 370c. The spring washer 379 is inserted to the engagement shaft 368c and the engagement shaft 370c at both ends of the shaft 366, the lock position regulating plate 380 is attached to the distal end face of the engagement shaft 368c and the engagement shaft 370c, and the caulking pin 382 is inserted and caulked to the hole 368e and the hole 370e.

The first hinge plate 362 is turnably supported with respect to the shaft 366 since the pass-through hole 362c of the engagement parts 362a, 362b arranged at two locations are turnably engaged with respect to the engagement shafts 368c, 368d at both ends of the shaft 368. The second hinge plate 364 is turnably supported with respect to the shaft 366 since the pass-through hole 364c of the engagement part 364a arranged at one location is turnably engaged with respect to the engagement shaft 370c at one end of the shaft 370. Therefore, both the first hinge plate 362 and the second hinge plate 364 are turnably attached with respect to the shaft 366.

Therefore, the display displaying unit 300 can be turnably supported with the shaft 366 which is the rigid member as a center axis of rotation by attaching the first hinge plate 362 and the second hinge plate 364 to the base plate 340.

In the present embodiment, the first hinge plate 362 and the second hinge plate 364 are turnably supported with respect to the shaft 366, but one hinge plate may be turnably supported. However, if the shaft 366 is long, the hinge plate might deform in a direction away from the shaft at the middle portion in the longitudinal direction of the shaft 366 if the hinge plate is turnably supported at the engagement part arranged at both ends of one hinge plate. The hinge plate might twist in the rotating direction and a difference in rotation angle position might be created between both ends of the hinge plate, whereby the hinge plate is unable to rotate smoothly. If the hinge plate is divided into the first hinge plate 362 and the second hinge plate 364 and two engagement parts 362a, 362b are arranged at both ends of the first hinge plate 362 as in the present embodiment, the engaging location with the shaft 366 can be increased to three locations in the hinge plate as a whole, thereby suppressing the hinge plate from deforming in the direction away from the shaft near the middle portion of the shaft 366. The rigidity of each hinge plate is increased and the twist of the hinge plate can be suppressed by dividing the hinge plate, whereby the rotation angle positions of the first hinge plate 362 and the second hinge plate 364 at both ends of the shaft 366 become the same. Therefore, the first hinge plate 362 and the second hinge plate 364 smoothly turn with respect to the shaft 366, and the tilt operation of the display displaying unit 300 can be smoothly carried out.

[Turning Lock Mechanism of Hinge Plate]

Figure 16:
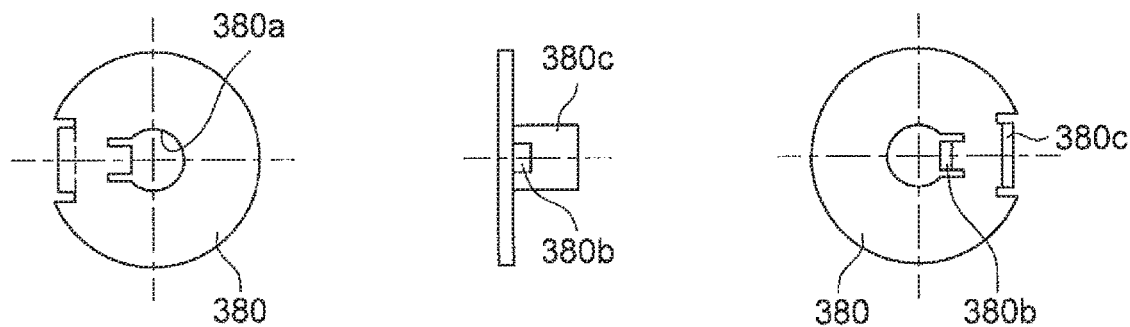
FIG. 16 is a frame format view showing a configuration of a lock position regulating plate.

FIG. 16 is a frame format view showing the lock position regulating plate 380. The lock position regulating plate 380 is formed by press working a plate material. As shown in FIG. 16, the lock position regulating plate 380 is formed with a hole 380a to be inserted with the caulking pin 382, a projection 380b engaging the engagement grooves 368f, 370f at the distal end of the engagement shafts 368c, 370c, and a projection 380c for regulating the turning lock position of the first hinge plate 362 and the second hinge plate 364.

Figure 17A:
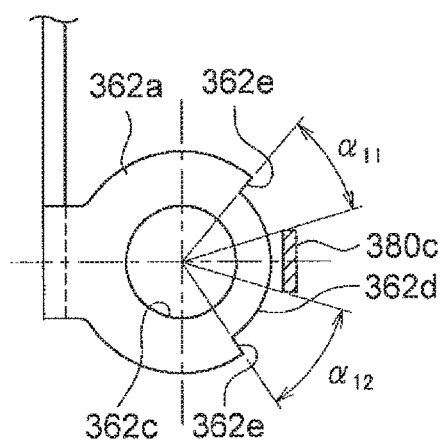
FIGS. 17A and 17B are frame format views showing a state in which the rotation positions of the first hinge plate and the second hinge plate are regulated by the lock position regulating plate.
Figure 17B:
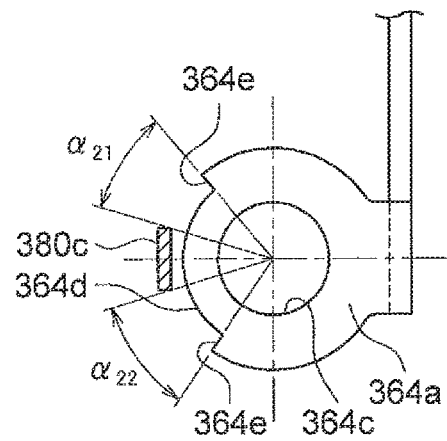

FIGS. 17A and 17B are frame format views showing a state in which the rotation angle position of the first hinge plate 362 and the second hinge plate 364 are regulated by the projection 380c of the lock position regulating plate 380. FIG. 17A shows a state of the engagement part 362a of the first hinge plate 362 seen from the direction of an arrow A2 in FIG. 13A. FIG. 17B shows a state of the engagement part 364a of the second hinge plate 364 seen from the direction of an arrow A3 in FIG. 13A.

As shown in FIG. 17A, the engagement part 362a of the first hinge plate 362 is formed with a concave part 362d at the contour thereof. When the projection 380b is inserted to the engagement groove 368f to attach the lock position regulating plate 380 to the distal end of the engagement shaft 368c, the projection 380c of the lock position regulating plate 380 comes to the position of the concave part 362d. When the first hinge plate 362 turns with the center axis of the shaft 366 as the center of rotation, the end face 362e on both sides of the concave part 362d contacts the projection 380c thereby regulating the turnable range of the first hinge plate 362.

Similarly, as shown in FIG. 17B, the engagement part 364a of the second hinge plate 364 is formed with a concave part 364d at the contour thereof. When the projection 380b is inserted to the engagement groove 370f to attach the lock position regulating plate 380 to the distal end of the engagement shaft 370c, the projection 380c of the lock position regulating plate 380 comes to the position of the concave part 364d. When the second hinge plate 362 turns with the center axis of the shaft 366 as the center of rotation, the end face 364e on both sides of the concave part 364d contacts the projection 380c thereby regulating the tumble range of the second hinge plate 364.

The angular range of the two end faces 362e of the concave part 362d of the first hinge plate 362 and the angular range of the two end faces 364e of the concave part 364d of the second hinge plate 364 are the same. As shown in FIG. 14A, the engagement grooves 368f and 370f for regulating the angular position of the lock position regulating plate 380 are positioned on the same angular position with respect to the center axis of the shaft 366 by defining the relative angular position of the shaft 368 and the shaft 370 with the pin 369. Thus, the angular position of the projection 380c with respect to the two end faces 362e of the concave part 362d is the same as the angular position of the projection 380c with respect to the two end faces 364e of the concave part 364d. Therefore, as shown in FIGS. 17A and 17B, the relationship $\alpha 11 = \alpha 21$ is met when moving the tilt of the display displaying unit 300 upward, where $\alpha 11$ is the movable angle of the first hinge plate 362 and $\alpha 12$ is the movable range of the second hinge plate 364. The relationship $\alpha 12 = \alpha 22$ is met When moving the tilt of the display displaying unit 300 downward, where $\alpha 12$ is the movable angle of the first hinge plate 362 and $\alpha 22$ is the movable range of the second hinge plate 364.

Therefore, when moving the tilt of the display displaying unit 300 upward or downward, the position at where the tilt is locked is the same position in both the first hinge plate 362 and the second hinge plate 364. Thus, the tilt position can be simultaneously locked at both ends of the shaft 366, where twist is reliably suppressed from occurring between the display displaying unit 300 and the shaft 366 when the tilt position is locked. Therefore, the upper side of the display displaying unit 300 can be suppressed from inclining with respect to the center axis of the shaft 366 at the lock position, and a smooth movement of the display displaying unit 300 can be realized.

Figure 18A:
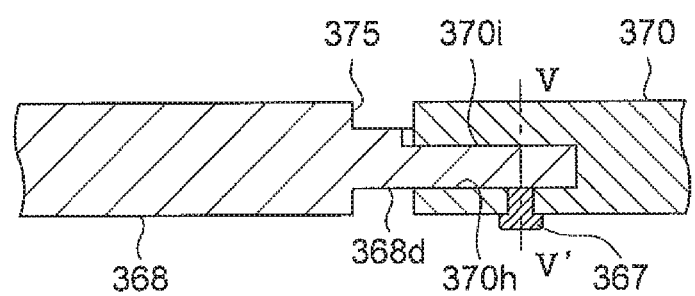
FIGS. 18A and 18B are frame format views showing another example of a configuration of a shaft.
Figure 18B:
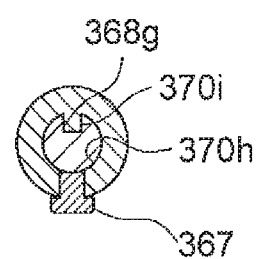

FIGS. 18A and 18B are frame format views showing another example of a configuration of connecting the shaft 368 and the shaft 370. FIG. 18A is a cross section taken along the center axis of the shaft 366. FIG. 18B is a frame format view showing a cross section taken along a chain dashed line V-V' in FIG. 18A. In the example of FIGS. 18A and 18B, the engagement shaft 368d of the shaft 368 is inserted to a hole 370h of the shaft 370, and a key 370i of the hole 370h and the key groove 368g of the engagement shaft 368d are engaged to regulate the angular position of the shaft 368 and the shaft 370. The shaft 368 and the shaft 370 are configured so that the shaft 368 does not slip out from the shaft 370 by caulking the fixing caulking pin 367 to the shaft 370. In such configuration as well, the angular positions of the engagement groove 368f of the shaft 368 and the engagement groove 370f of the shaft 370 can be regulated, and the position at where the tilt position is locked becomes the same in both the first hinge plate 362 and the second hinge plate 364.

[Positioning of Bezel and Organic EL Panel]

Figure 19B:
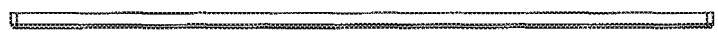
FIGS. 19A to 19C are frame format views showing a bezel.
Figure 19C:
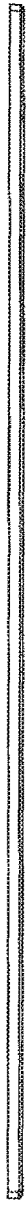
Figure 19A:
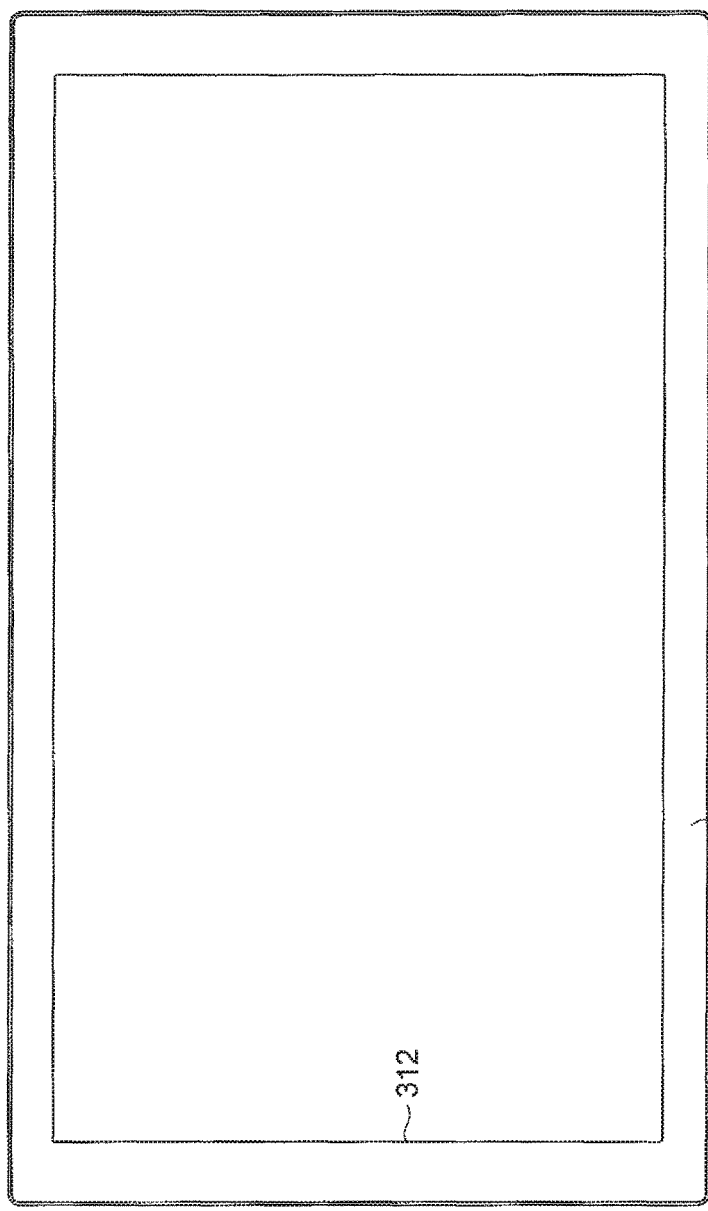

FIGS. 19A to 19C are frame format views showing the bezel 310. FIG. 19A is a front view showing the bezel 310 from the front surface side of the display displaying unit 300, FIG. 19B is a right side view of FIG. 19A, and FIG. 19C is a top view of FIG. 19A. FIG. 20 is a frame format view showing the bezel 310 from the rear surface side of the display displaying unit 300.

As shown in FIGS. 19A to 19C and 20, an opening 312 is formed in the bezel 310. The bezel 310 is covered from the front side with respect to the organic EL panel 320, so that the display screen 300a of the organic EL panel 320 is positioned in the opening 312.

As shown in FIG. 20, a plurality of bosses 314 for positioning with respect to the organic EL panel 320 is formed on the back surface of the bezel 310. The plurality of bosses 314 are configured with two adjacent bosses forming one set, and a positioning holder 440 is inserted to the adjacent bosses 314.

As shown in FIG. 20, a plurality of screw holes 316 is formed on the back surface of the bezel 310. The rear cover 420 is fixed with respect to the bezel 310 with the organic EL panel 320 sandwiched with the bezel 310 by tightening the screw inserted to the pass-through hole 424 shown in FIGS. 8A and 8B to the screw hole 316 of the bezel 310.

Figure 21:
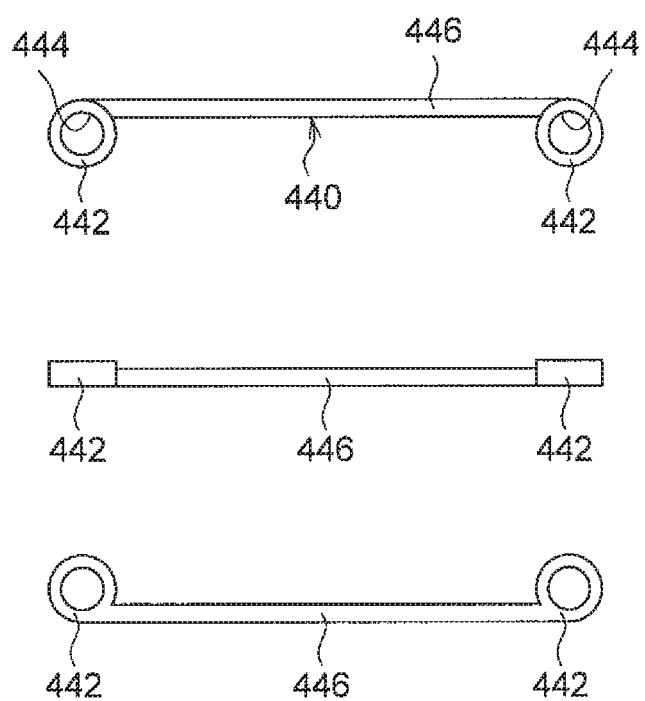
FIG. 21 is a frame format view showing a configuration of a holder.

FIG. 21 is a frame format view showing a configuration of the holder 440. The holder 440 is made of elastic material such as rubber. The holder 440 includes two ring parts 442 formed with a pass-through hole 444 and a coupling part 446 for coupling the ring parts 442. The two ring parts 442 are inserted to two adjacent bosses 314 of the bezel 310.

Figure 22:
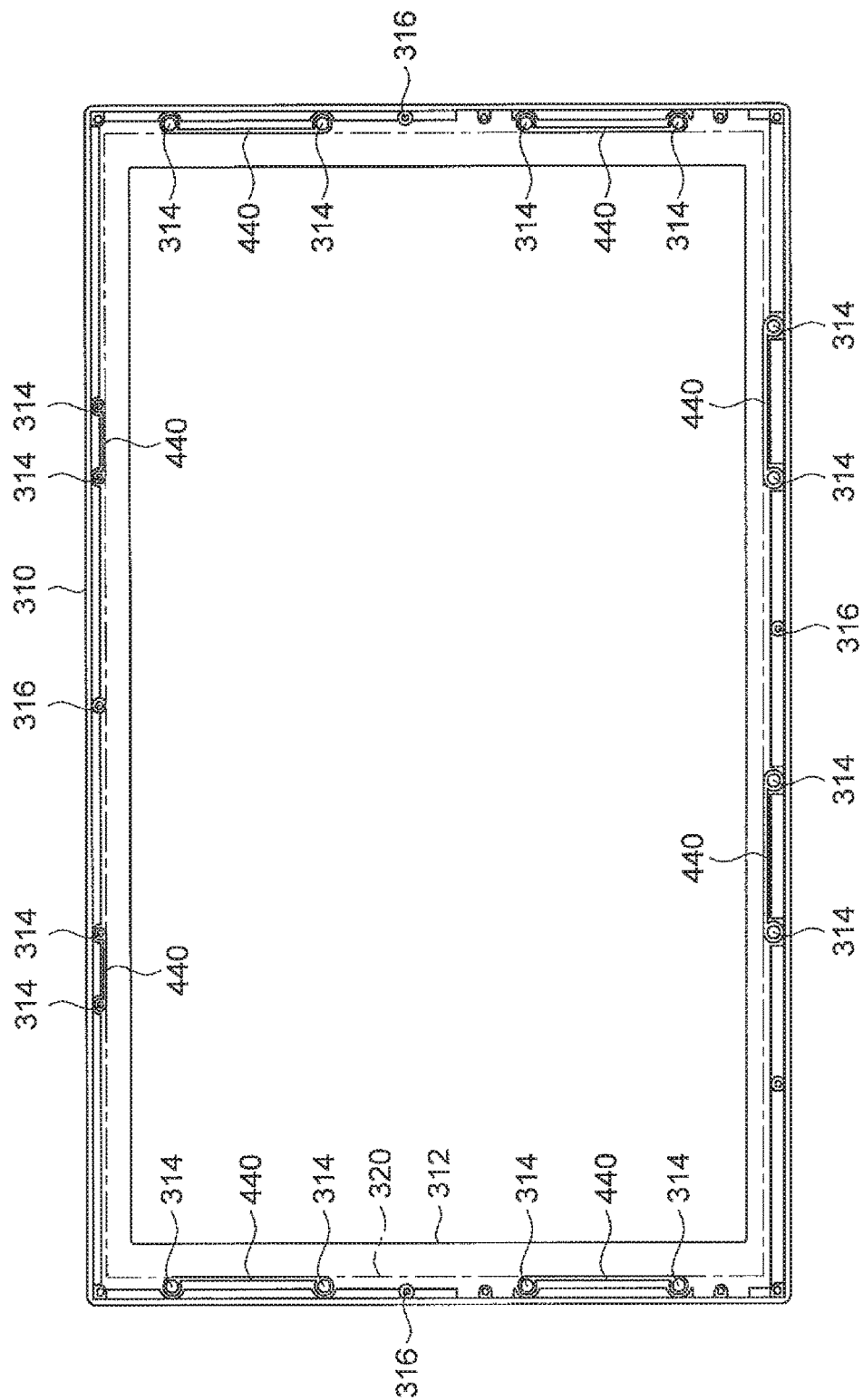
FIG. 22 is a frame format view showing a state in which the holder is attached to the bezel.

FIG. 22 shows a state in which the pass-through hole 444 of the ring part 442 is inserted to the two adjacent bosses 314 on the back surface of the bezel 310, and the holder 440 is attached to the bezel 310. As shown in FIG. 22, a plurality of holders 440 having different sizes is attached at a plurality of locations on the long side and the short side of the bezel 310. An outer shape (shown with chain dashed line in FIG. 22) of the organic EL panel 320 contacts the contour of the ring part 442, and the ring part 442 elastically deforms.

Therefore, the bezel 310 is positioned with respect to the organic EL panel 320 through the holder 440 inserted to the boss 314. According to such configuration, since the edge of the organic EL panel 320 contacts the edge of the ring part 442 and elastically deforms the ring part 442, the bezel 310 can be positioned with respect to the organic EL panel 320 at satisfactory accuracy. Even if an external force such as impact force is applied between the bezel 310 and the organic EL panel 320, the impact force can be absorbed by the elasticity of the holder 440. In particular, since the organic EL panel 320 is made of glass and is weak with respect to the impact force, the organic EL panel 320 can be reliably prevented from being damaged by absorbing the impact force with the elasticity of the holder 440.

Therefore, in the display displaying unit 300 of the present embodiment configured very thin, the force externally applied to the display displaying unit 300 can be reliably absorbed, and the reliability with respect to external force such as impact force can be reliably enhanced.

[Substrate Wiring Structure of Display Displaying Unit]

Figure 23:
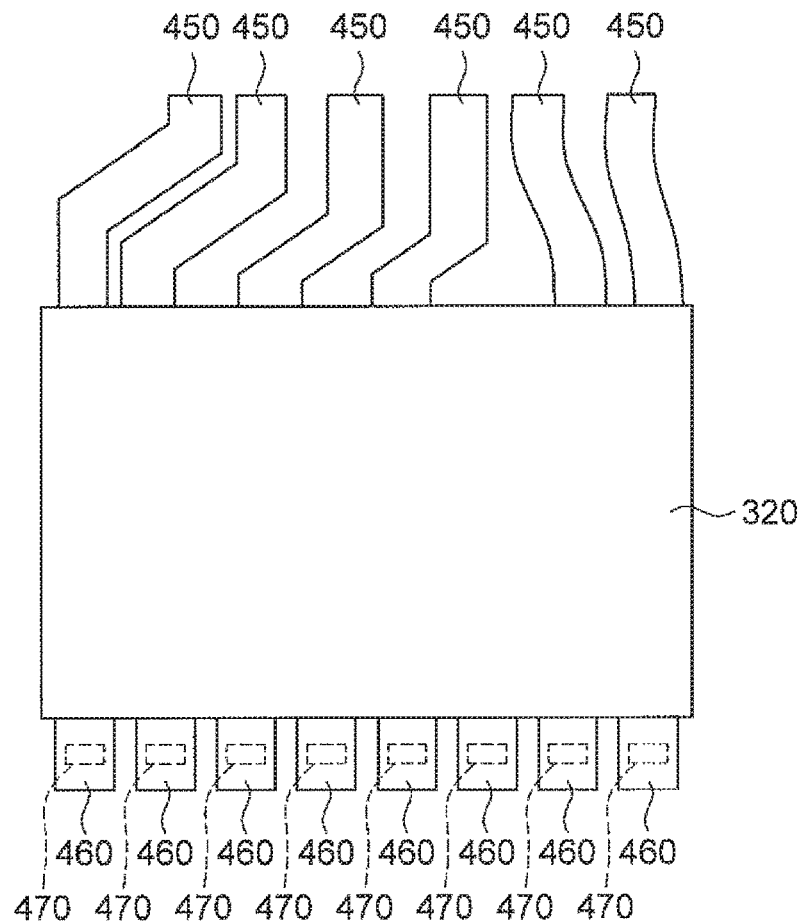
FIG. 23 is a frame format view showing a state in which a flexible print substrate and the organic EL panel are connected.

FIG. 23 is a frame format view showing a state in which the flexible print substrates 450, 460 for connecting the organic EL panel 320 and the T-substrate 350 are connected with the organic EL panel 320. As shown in FIG. 23, the flexible print substrate 450 arranged with a power supply line is connected to the upper end of the organic EL panel 320. The flexible print substrate 460 arranged with a signal line is connected to the lower end of the organic EL panel 320. A driver IC 470 is mounted on the flexible print substrate 460. The driver IC 470 is a driver IC for transmitting a control signal to light emit each organic EL element of the organic EL panel 320.

Figure 24:
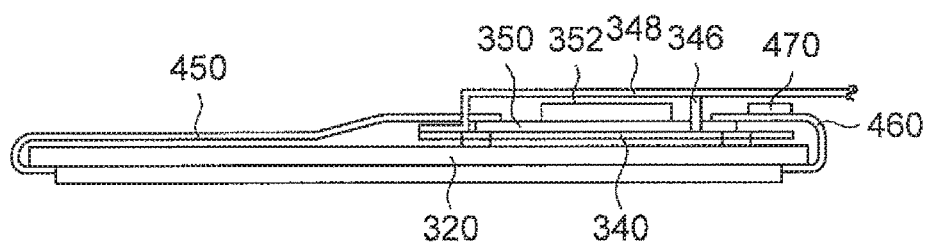
FIG. 24 is a frame format view showing a state in which the configuration of FIG. 23 is incorporated in the display displaying unit.

FIG. 24 is a frame format view showing a state in which the configuration of FIG. 23 is incorporated in the display displaying unit 300, and shows the organic EL panel 320, the base plate 340, the T-substrate 350, and the flexible print substrates 450, 460 seen from the side surface side of the display displaying unit 300.

As shown in FIG. 24, the flexible print substrate 450 pulled out from the upper end of the organic EL panel 320 is folded back 180° and connected to the T-substrate 350. The flexible print substrate 460 pulled out from the lower end of the organic EL panel 320 is folded back 180° and connected to the T-substrate 350. Therefore, the T-substrate 350 is not arranged on the entire surface of the organic EL panel 320 at the rear surface of the organic EL panel 320, and the occupying region of the T-substrate 350 can be suppressed to a minimum.

The T-substrate 350 can be arranged in a minimum range at the lower part of the organic EL panel 320, and in particular, the thickness of the display displaying unit 300 can be suppressed to a minimum at the region of the upper part of the T-substrate 350. The thickness of the display displaying unit 300 is mainly regulated by the organic EL panel 320, the graphite sheet 330, and the rear cover 420 in the region not arranged with the T-substrate 350, and thus the thickness of the display displaying unit 300 can be made very thin to about 3 mm, and the display displaying unit 300 excelling in airiness and floating feeling can be configured.

The organic EL panel 320 and the T-substrate 350 can be electrically connected without widening the outer shape of the organic EL panel 320 by connecting the flexible print substrates 450, 460 pulled out from the T-substrate 350 and folded back 180° to the organic EL panel 320. According to the substrate wiring structure of the display displaying unit 300 of the present embodiment, the size of the display displaying unit 300 can be suppressed to a minimum, and the display displaying unit 300 can be miniaturized.

FIG. 24 also shows a state in which the base plate 340 and a supporting member 348 (first hinge plate 362 and second hinge plate 364) for supporting the base plate 340 are coupled. The base plate 340 is adhered and coupled to at least one part of the supporting member 348 or is coupled with the supporting member 348 by way of a fixing part 346. As described above, the base plate 340 is coupled to the first hinge plate 362 and the second hinge plate 364 serving as the supporting member 348, but the supporting member 348 shown in FIG. 24 may act as a configuring member such as a stand arm arranged upright from the body stand unit if a tilt adjustment mechanism is not arranged in the display displaying unit 300. In this case as well, the main members configuring the display displaying unit 300 such as the base plate 340 and the T-substrate 350 are arranged at the lower part of the display displaying unit 300 in a concentrated manner, and the thickness on the upper side of the display displaying unit 300, in particular, can be suppressed to a minimum.

[Heat Radiation Structure by Hinge]

The power supply line and the signal line connected with the organic EL panel 320 are arranged on the T-substrate 350. An electronic component 352 is mounted on the T-substrate 350. In the present embodiment, the T-substrate 350 is arranged between the first hinge plate 362 and the second hinge plate 364 of the hinge 360 and the base plate 340. Thus, heat generated at the T-substrate 350 or the electronic component 352 by the drive of the circuit is transferred to the first hinge plate 362 and the second hinge plate 364 made of metal having high heat conductivity and then diffused. Therefore, the heat of the T-substrate 350 can be efficiently radiated. The heat transmitted to the first hinge plate 362 and the second hinge plate 364 are released outward through the rear cover 420 and the T-cover 430 made of metal. The display displaying unit 300 is thus reliably suppressed from being heated by the generated heat of the T-substrate 350. In order to efficiently transfer heat from the T-substrate 350 or the electronic component 352 to the first hinge plate 362 and the second hinge plate 364, the T-substrate 350 or the electronic component 352 and the first hinge plate 362 and the second hinge plate 364 may be contacted through a heat conductive member.

Figure 25:
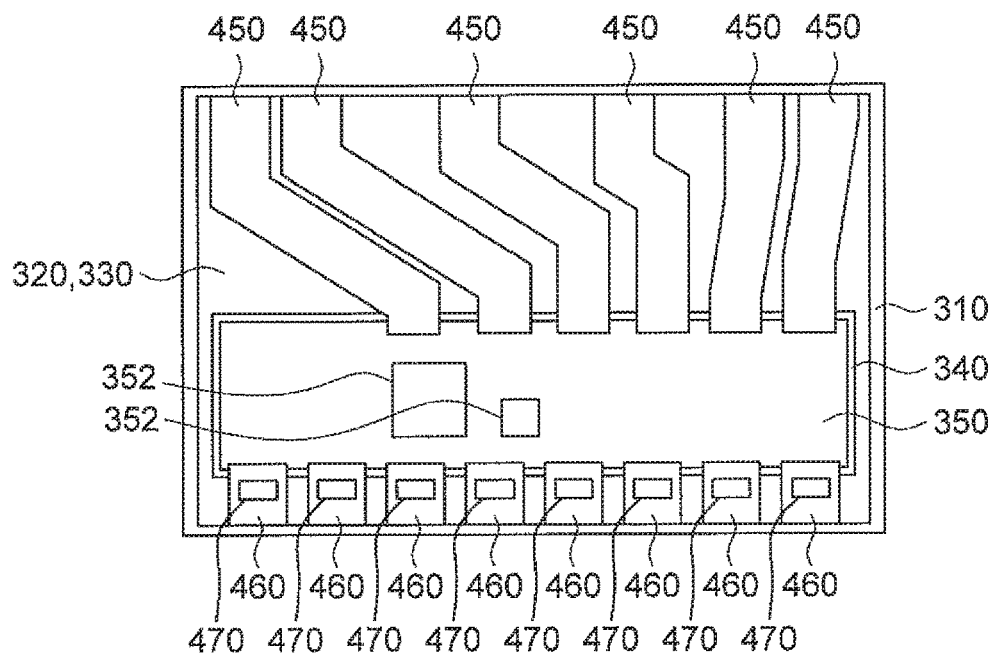
FIG. 25 is a frame format view showing the state of FIG. 24 seen from the rear surface side of the display displaying unit.

FIG. 25 is a frame format view showing a state of FIG. 24 seen from the rear surface side of the display displaying unit 300. As shown in FIG. 25, a plurality of flexible print substrates 460 pulled out from the lower end of the organic EL panel 320 is folded back 180° to be connected to the T-substrate 350, so that the driver IC 470 is arrayed on one line in the horizontal direction. The driver IC 470 is arranged near the shaft 366 along the extending direction of the shaft 366.

Figure 26:
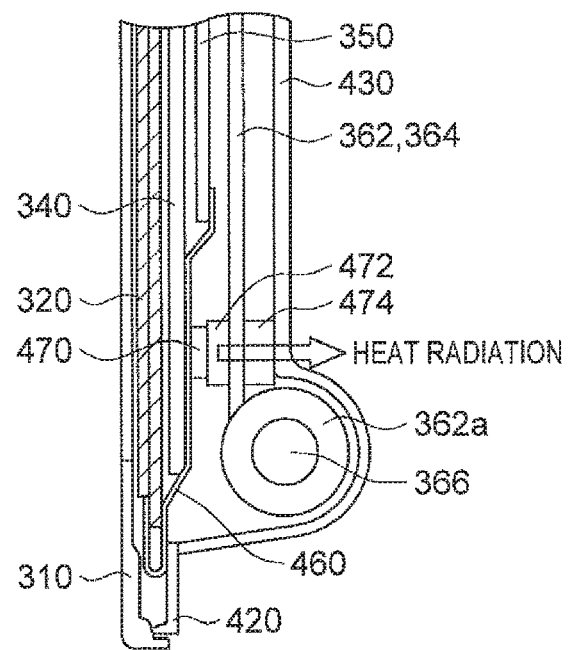
FIG. 26 is a frame format view showing a cross section near the shaft of the display displaying unit.

FIG. 26 is a frame format view showing a cross section near the shaft 366 of the display displaying unit 300. As shown in FIG. 26, the driver IC 470 mounted on the flexible print substrate 460 is arranged at the positions of the root of the first hinge plate 362 and the second hinge plate 364.

As shown in FIG. 26, the driver IC 470, and the first hinge plate 362 and the second hinge plate 364 are connected by way of a heat radiation sheet 472. Furthermore, the first hinge plate 362 and the second hinge plate 364, and the rear cover 420 are connected by way of a heat radiation sheet 474.

According to such configuration, the heat generated from the driver IC 470 is transferred to the first hinge plate 362 and the second hinge plate 364 through the heat radiation sheet 472 and then diffused. The heat of the first hinge plate 362 and the second hinge plate 364 is transferred to the rear cover 420 through the heat radiation sheet 474, and radiated to the outside of the display displaying unit 300. The heat radiation effect becomes higher since the rear cover 420 is made of metal. The heat in the display displaying unit 300 can be thus efficiently radiated.

The driver IC 470 is arrayed in the column direction (horizontal direction) of the panel along the lower end of the organic EL panel 320 to control the signal of each organic EL element arrayed in the organic EL panel 320. The shaft 366 of the hinge 360 is also arranged extending in the horizontal direction along the lower end of the organic EL panel 320 since the tilt position of the display displaying unit 300 also varies. Thus, in the display device 1000 of the present embodiment, the arraying direction of the driver IC 470 and the extending direction of the shaft 366 of the hinge 360 can be in the same direction, and the arrangement positions of the driver IC 470, and the first hinge plate 362 and the second hinge plate 364 can be adapted. The heat generated in the driver IC 470 can be thus reliably radiated through the first hinge plate 362 and the second hinge plate 364.

Figure 27:
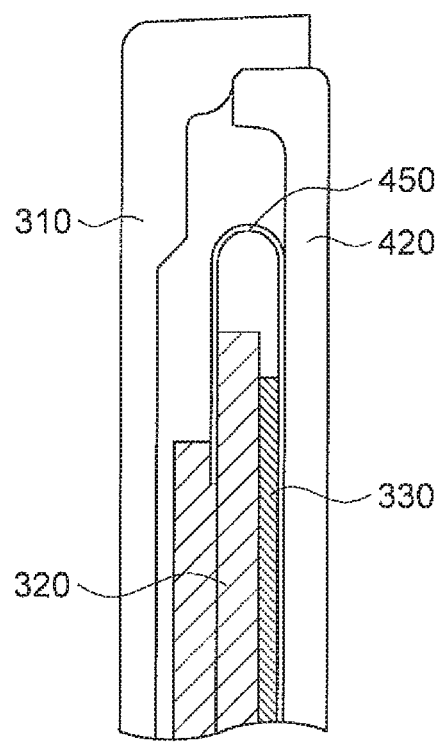
FIG. 27 is a frame format view showing a cross sectional configuration of an upper part of the display displaying unit.

FIG. 27 is a frame format view showing a cross sectional configuration of the upper part of the display displaying unit 300. As shown in FIG. 27, a plurality of flexible print substrates 450 pulled out from the upper end of the organic EL panel 320 is folded back 180° and led to the T-substrate 350 on the lower side while being closely attached to the rear cover 420. The graphite sheet 330 is attached to the front of the back surface of the organic EL panel 320, and the flexible print substrate 450 is positioned between the graphite sheet 330 and the rear cover 420.

According to such configuration, the heat generated in the organic EL panel 320 is transferred to the graphite sheet 330, and then diffused and equalized in the graphite sheet 330. The heat diffused in the graphite sheet 330 is transferred to the rear cover 420, and released outward from the rear cover 420. The heat radiation effect becomes higher since the rear cover 420 is made of metal. Therefore, the internal heat is efficiently released outward from the rear cover 420 at the upper part of the display displaying unit 300.

[Configuration of Body Stand Unit]

Figure 28:
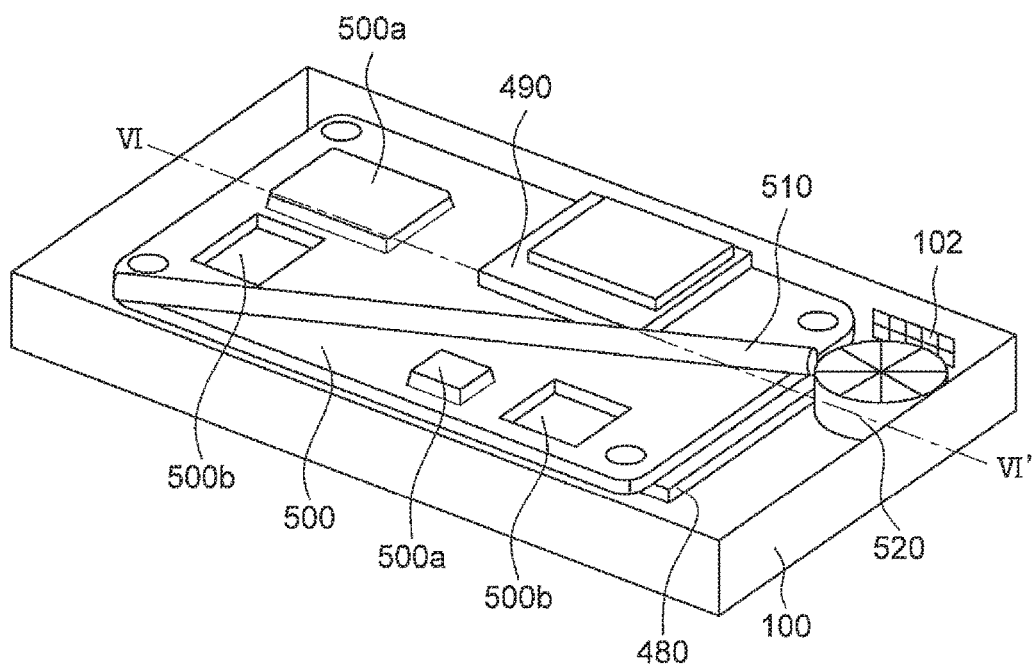
FIG. 28 is an exploded perspective view showing a schematic configuration of the body stand unit.

FIG. 28 is an exploded perspective view showing a schematic configuration of the body stand unit 100, showing a state in which the cover on the upper surface of the body stand unit 100 is detached. The housing of the body stand unit 100 is made of metal. A circuit substrate (O substrate) 480 for performing signal processing to drive the display displaying unit 300, a circuit substrate (B-CAS substrate) 490, a cooling fan 520, a radiator plate (heat spreader) 500, and the like are compactly incorporated inside the body stand unit 100. Various terminals such as tuner for satellite broadcast (BS, CS), ground digital wave etc., LAN, HDMI, USB, and the like are incorporated in the body stand unit 100, and a rod antenna 104 (see FIG. 1B) for receiving the ground digital wave is arranged on the back surface side. A speaker box, an operation button, and the like are also incorporated in the body stand unit 100.

Figure 29:
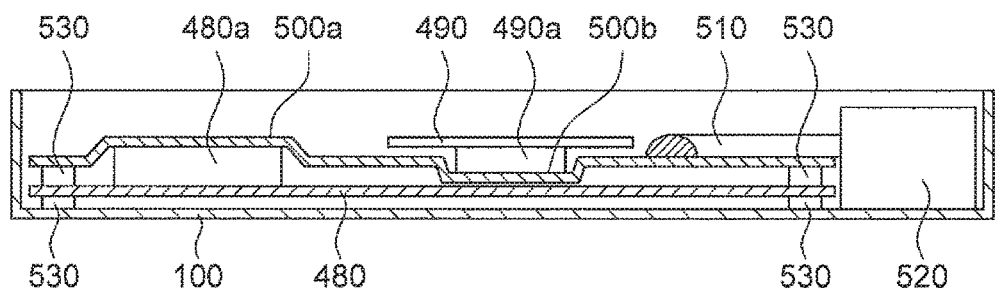
FIG. 29 is a frame format view showing a cross section taken along a chain dashed line VI-VI' in FIG. 28.

FIG. 29 is a frame format view showing a cross section taken along a chain dashed line VI-VI' in FIG. 28, showing a position relationship between the circuit substrates 480, 490 and the radiator plate 500. A plurality of electronic components 480a is mounted on the circuit substrate 480. One or a plurality of electronic components 490a is mounted on the circuit substrate 490.

The radiator plate 500 has a rectangular shape corresponding to the shape of the body stand unit 100, and is made from a press molded metal plate. The radiator plate 500 extends over a wide range including a region not mounted with the electronic components 480a at inside the body stand unit 100.

The radiator plate 500 includes a plurality of convex surfaces 500a and concave surfaces 500b arranged corresponding to the positions of the electronic components 480a, 490a mounted on the circuit substrates 480, 490, and the electronic components 480a, 490a mounted on the circuit substrates 480, 490 contact the radiator plate 500 at the positions of the convex surfaces 500a or the concave surfaces 500b. The height and the depth of the convex surfaces 500a and the concave surface 500b correspond to the plurality of electronic components 480a having different heights from the surface of the circuit substrate 480, where the plurality of electronic components 480a having different heights contact the radiator plate 500 when the radiator plate 500 is attached to the circuit substrate 480. Similarly, the height and the depth of the convex surface 500a and the concave surface 500b correspond to the height of the electronic component 490a mounted on the circuit substrate 490. The radiator plate 500 may directly contact the electronic components 480a, 490a, or may indirectly contact the electronic components 480a, 490a by way of a heat conductive sheet (heat radiation sheet) such as silicon rubber.

The radiator plate 500 is integrally configured with the cooling fan 520 to configure a cooling unit with the cooling fan 520.

The cooling fan 520 is configured from a centrifugal fan, and exhausts air taken in from the top and the bottom from the side surface. An intake port (not shown) for taking in outside air is formed in the body stand unit 100 at the lower part of the cooling fan 520. The air taken in from the intake port through rotation of the cooling fan 520 is exhausted to the outside from the opening 102 formed at the back surface of the body stand unit 100.

As shown in FIG. 28, a heat pipe 510 extending from one corner of the radiator plate 500 towards the cooling fan 520 is arranged on the upper surface of the radiator plate 500. The heat pipe 510 is configured from a copper pipe, copper rod, and the like, and is fixed on the upper surface of the radiator plate 500 through welding. The heat pipe 510 is linearly arranged so as to pass through positions not formed with the convex surface 500a and the concave surface 500b of the radiator plate 500. According to such configuration, the heat pipe 510 can be configured in a straight line, and the manufacturing cost can be reduced.

As shown in FIG. 29, the upper surface of the electronic component 480a arranged on the circuit substrate 480 contacts the radiator plate 500 at the position of the convex surface 500a of the radiator plate 500. The lower surface of the chip 490a arranged on the circuit substrate 490 contacts the radiator plate 500 at the position of the concave surface 500b of the radiator plate 500. In this case, each electronic component 480a, 480b and the radiator plate 500 are contacted through the heat radiation sheet, so that the heat from each electronic component 480a, 480b can be efficiently transmitted to the radiator plate 500 and then diffused.

The heat transmitted to the radiator plate 500 is guided to the cooling fan 520 from the heat pipe 510 of the radiator plate 500. Therefore, the heat generated in the electronic component 480a, 480b of the circuit substrate 480, 490 can be heat transferred along the heat pipe 510, and released outward from the cooling fan 520.

A joint part 530 is arranged between the radiator plate 500 and the circuit substrate 480. The joint part 530 is also arranged between the body stand unit 100 and the circuit substrate 480. If the joint part 530 is made of conductive material, the ground line of the circuit substrate 480, and the body stand unit 100 and the radiator plate 500 are connected so that the radiator plate 500 is grounded. According to such configuration, heat radiation is performed by the radiator plate 500, and the radiator plate 500 can be grounded, whereby the influence of noise on the circuit substrates 480, 490 can be reliably suppressed, and the reliability can be enhanced.

Figure 30:
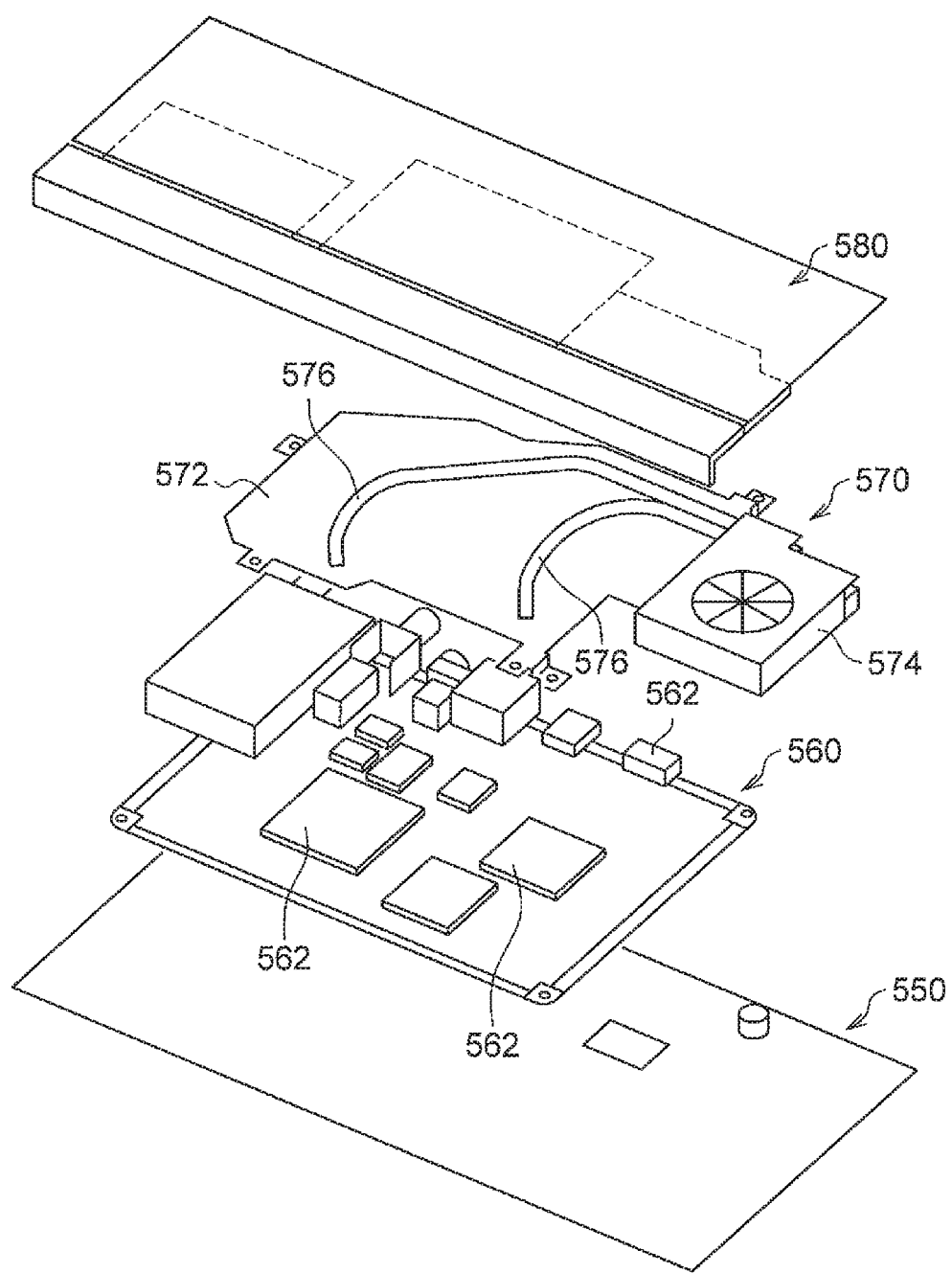
FIG. 30 is an exploded perspective view showing in detail another example of an inner configuration of the body stand unit.

FIG. 30 is an exploded perspective view showing in detail another example of an inner configuration of the body stand unit 100. As shown in FIG. 30, a bottom cover 550, a main substrate 560, a cooling unit 570, and a top cover block 580 are arranged in order from the lower side in the body stand unit 100.

Figure 31:
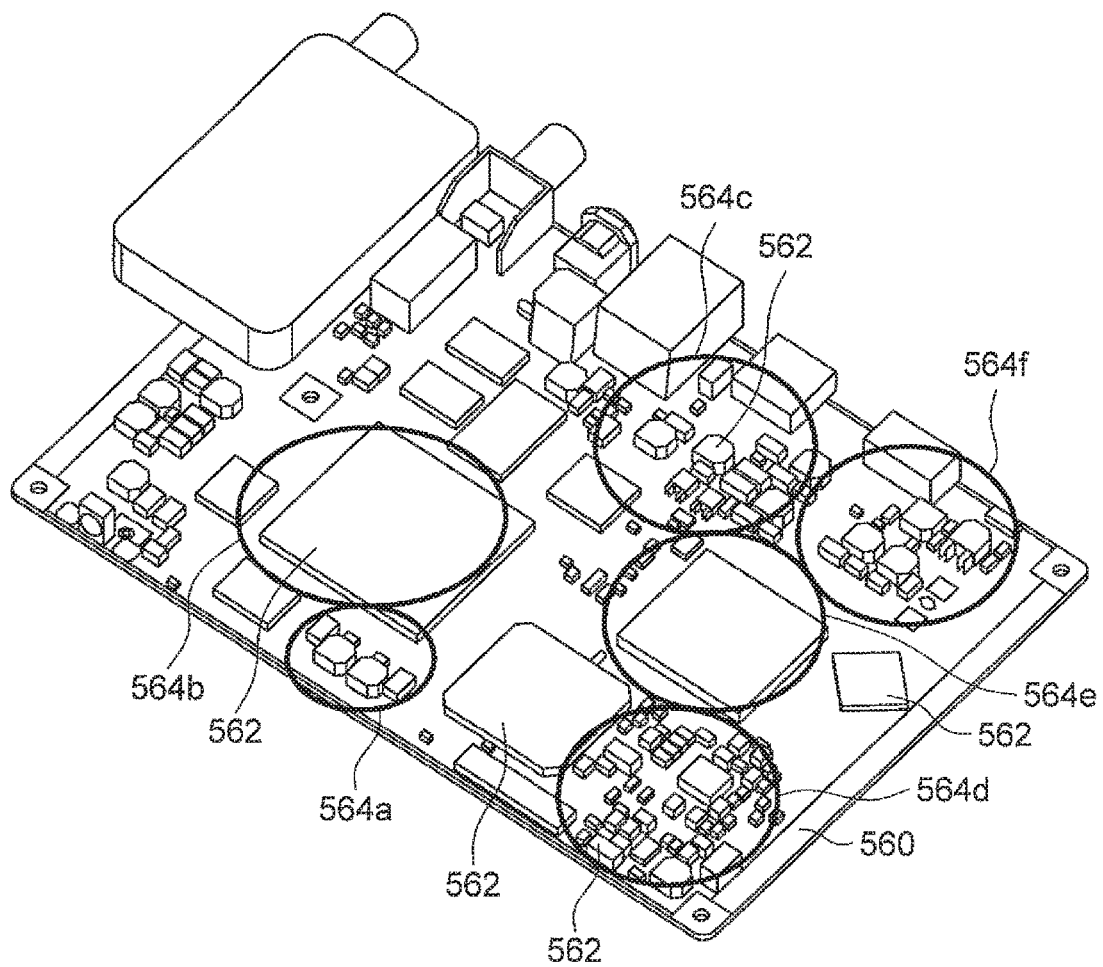
FIG. 31 is a perspective view showing an upper surface of a main substrate shown in FIG. 30.

FIG. 31 is a perspective view showing an upper surface of the main substrate 560. A great number of electronic components 562 are arranged on the upper surface of the main substrate 560. Six regions 564a, 564b, 564c, 564d, 564e, and 564f shown in FIG. 31 are regions where the heat divergence from the electronic components 562 is particularly large.

Figure 32:
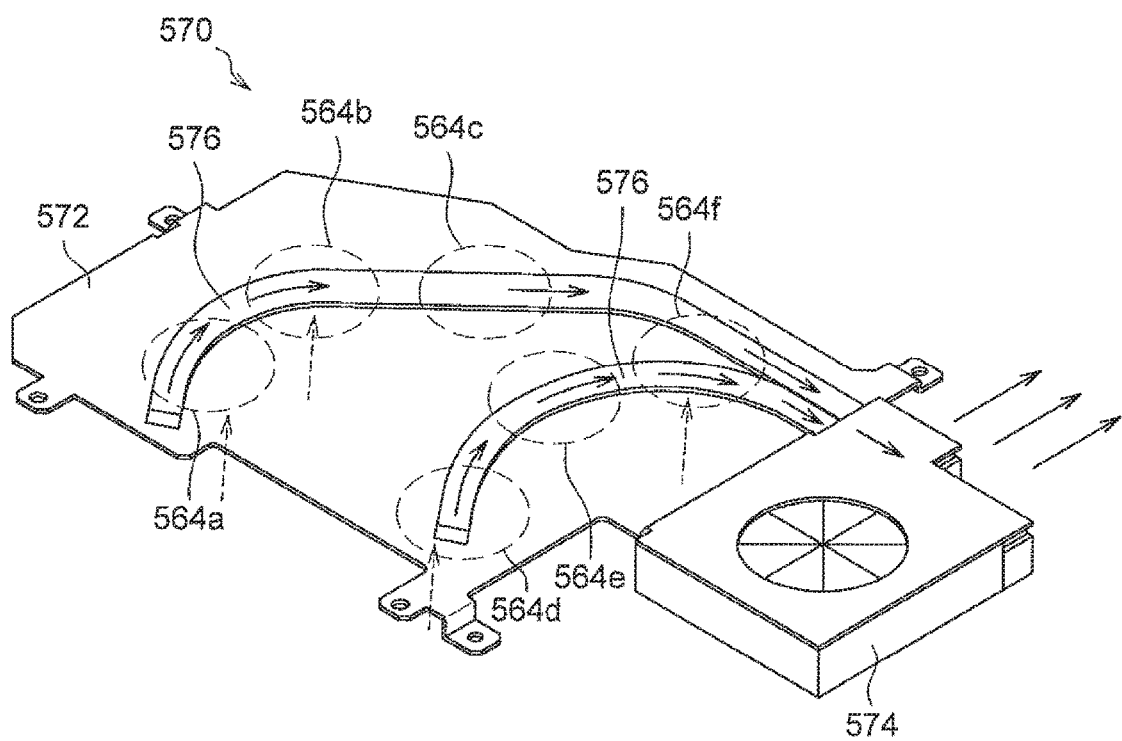
FIG. 32 is a frame format view showing a cooling unit arranged on the main substrate.

FIG. 32 shows the cooling unit 570 arranged on the main substrate 560. Similar to the example of FIG. 28, the cooling unit 570 is integrally configured with a radiator plate 572 and a cooling fan 574.

FIG. 32 shows the positions of the regions 564a to 564f in FIG. 31 in correspondence to the upper surface of the radiator plate 572. As shown in FIG. 32, two heat pipes 576 are arranged at positions corresponding to the regions 564a to 564f, where the ends of the heat pipes 576 are connected to the cooling fan 574. Similar to the cooling fan 520 of FIG. 28, the cooling fan 574 is configured from a centrifugal fan, and exhausts the air taken in from the top and the bottom from the side and exhausts the air to the outside of the body stand unit 100.

According to the above configuration, the heat generated in the electronic components 562 is transmitted to the heat pipes 576, and sent to the cooling fan 574 through the heat pipes 576 since the heat pipes 576 are arranged so as to pass through the regions 564a to 564f having large heat divergence on the main substrate 560. Therefore, the main heat generated in the main substrate 560 can be efficiently sent to the cooling fan 574, and the heat inside the body stand unit 100 can be efficiently released outward.

It should be understood by those skilled in the art that various modifications, combinations, sub-combinations and alterations may occur depending on design requirements and other factors insofar as they are within the scope of the appended claims or the equivalents thereof.

What is claimed is:

1. A display device, comprising:
   a display unit having an electro luminescence panel on a first front surface of the display unit; and
   a substrate that is only in a lower half region of a first back surface of the display unit,
   wherein the substrate is connected with a second front surface of the electro luminescence panel via a first flexible wiring including a signal line,
   wherein the first front surface of the display unit is opposite to the first back surface of the display unit, and
   wherein a first end of the first flexible wiring is connected to the substrate and a second end of the first flexible wiring is connected to a lower side of the second front surface of the electro luminescence panel.

2. The display device according to claim 1, further comprising a supporting unit to support the display unit.

3. The display device according to claim 2, wherein the supporting unit comprises a transparent material.

4. The display device according to claim 3, wherein the supporting unit comprises one of a resin or a glass.

5. The display device according to claim 2, further comprising a body unit, wherein the supporting unit is mounted upright on the body unit.

6. The display device according to claim 5, wherein the supporting unit is inclined towards the first back surface of the display unit from a rear side of the body unit.

7. The display device according to claim 5, further comprising a second flexible wiring that connects the body unit and the display unit,
   wherein the second flexible wiring is in the supporting unit.

8. The display device according to claim 1, wherein the substrate is connected with an upper side of the second front surface of the electro luminescence panel via a third flexible wiring including a power supply line.

9. The display device according to claim 1, wherein the display unit further comprises a rear cover and a heat radiation member,
   wherein the heat radiation member is between a second back surface of the electro luminescence panel and the rear cover.

10. The display device according to claim 9, wherein the heat radiation member is configured to transfer heat generated in the electro luminescence panel to the rear cover.

11. The display device according to claim 9, wherein the heat radiation member is a graphite sheet.

12. The display device according to claim 9, wherein the rear cover comprises a metal.

13. The display device according to claim 2, further comprising:
    a hinge that connects the display unit and the supporting unit,
       wherein the hinge turnably supports the display unit with respect to a center axis of rotation of the display unit.

14. The display device according to claim 2, wherein the supporting unit comprises a first arm unit positioned on an upper part of the supporting unit and a second arm unit positioned on a lower part of the supporting unit.

15. The display device according to claim 2, wherein the supporting unit has an opening, and
    wherein the opening is in a side face of the supporting unit along a longitudinal direction corresponding to the supporting unit such that the supporting unit has a hollow structure.

16. A display device, comprising:
    a display unit comprising:
       an electro luminescence panel;
       a rear cover; and
       a heat radiation member,
          wherein the heat radiation member is between a first back surface of the electro luminescence panel and the rear cover;

a supporting unit to hold the display unit,
- wherein the supporting unit comprises a transparent material; and a substrate in a lower half region of a second back surface of the display unit,
- wherein the substrate is connected with a first front surface of the electro luminescence panel via a first flexible wiring including a signal line,
- wherein the first front surface of the electro luminescence panel is opposite to the first back surface of the electro luminescence panel, and
- wherein a first end of the first flexible wiring is connected to the substrate and a second end of the first flexible wiring is connected to a lower side of the first front surface of the electro luminescence panel.

17. The display device according to claim 16, wherein the supporting unit comprises one of a resin or a glass.

18. The display device according to claim 16, wherein the heat radiation member is configured to transfer heat generated in the electro luminescence panel to the rear cover.

19. The display device according to claim 16, wherein the heat radiation member is a graphite sheet.

20. The display device according to claim 16, wherein the rear cover comprises a metal.

* * * * *